United States Patent
Tamura et al.

(10) Patent No.: US 9,213,796 B2
(45) Date of Patent: Dec. 15, 2015

(54) METHOD FOR DESIGNING SEMICONDUCTOR INTEGRATED CIRCUIT AND PROGRAM

(71) Applicant: FUJITSU LIMITED, Kawasaki-shi, Kanagawa (JP)

(72) Inventors: Hirotaka Tamura, Yokohama (JP); Jason Anderson, Toronto (CA); Safeen Huda, Toronto (CA); Hiroaki Fujimoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/454,539

(22) Filed: Aug. 7, 2014

(65) Prior Publication Data
US 2015/0067630 A1 Mar. 5, 2015

(30) Foreign Application Priority Data
Aug. 30, 2013 (JP) .................................. 2013-179746

(51) Int. Cl.
*G06F 17/50* (2006.01)
(52) U.S. Cl.
CPC .................. *G06F 17/5077* (2013.01)
(58) Field of Classification Search
CPC ............................ G06F 17/5077; H02M 3/07
USPC .......................................... 716/101, 104, 126
See application file for complete search history.

(56) References Cited

U.S. PATENT DOCUMENTS

| | | | | |
|---|---|---|---|---|
| 5,369,320 A | * | 11/1994 | Satani et al. | 327/108 |
| 5,489,859 A | * | 2/1996 | Kawaguchi et al. | 326/57 |
| 6,222,390 B1 | * | 4/2001 | Huang | 326/88 |
| 2009/0146734 A1 | | 6/2009 | Fallah et al. | |

FOREIGN PATENT DOCUMENTS

| | | |
|---|---|---|
| JP | 07-212215 A | 8/1995 |
| JP | 2001-195163 A | 7/2001 |
| JP | 2011-250107 A | 12/2011 |
| JP | 2012-095358 A | 5/2012 |

OTHER PUBLICATIONS

L. McMurchie et al., "Pathfinder: A Negotiation-Based Performance-Driven Router for FPGAs," ACM/SIGDA International Symposium on Field Programmable Gate Arrays, 1995, pp. 111-117, Monterey, CA, USA.
S. Chan et al., "Uniform-Phase Uniform-Amplitude Resonant-Load Global Clock Distributions," IEEE Journal of Solid-State Circuits, Jan. 2005, pp. 102-109, vol. 40, No. 1.

* cited by examiner

*Primary Examiner* — Sun Lin
(74) *Attorney, Agent, or Firm* — Arent Fox LLP

(57) ABSTRACT

A method for designing a semiconductor integrated circuit includes: determining, by a designing device, first wirings over which signals are propagated and second wirings which are not used for propagation of the signals among a plurality of wirings of a semiconductor integrated circuit; and determining, by the designing device, from among the second wirings, third wirings to be used for storing electrical charges for electrical charge recycling of the first wirings for a most number of the first wirings in a range that satisfies a timing constraint based on operation rates of the signals propagated over the first wirings and delay times of the first wirings.

6 Claims, 27 Drawing Sheets

FIG.1
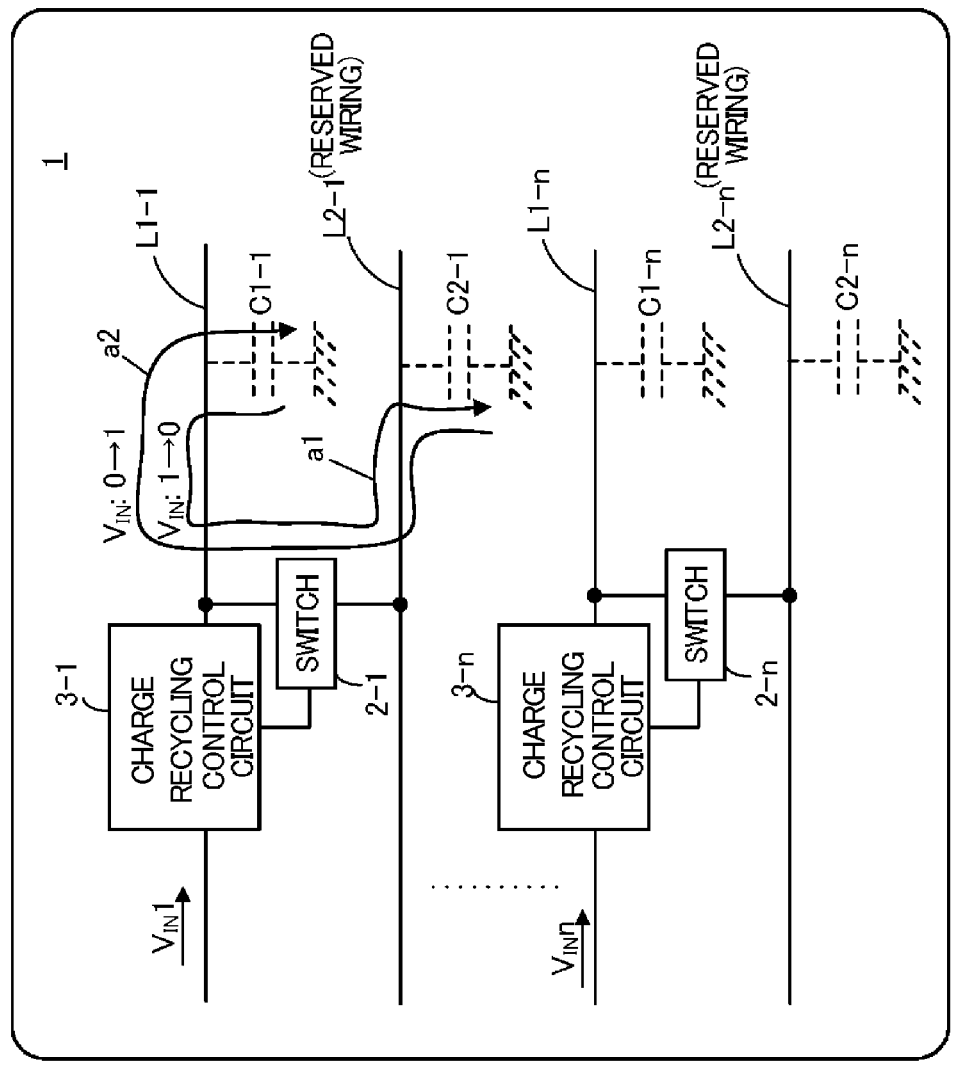
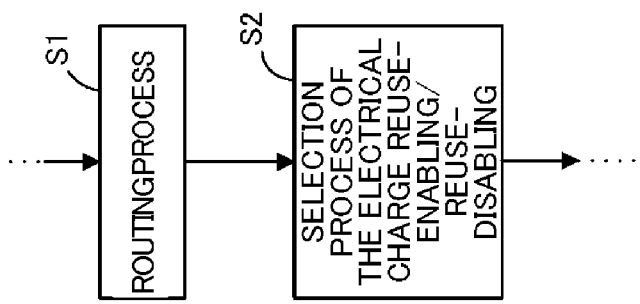

ITED STATES PATENT

METHOD FOR DESIGNING SEMICONDUCTOR INTEGRATED CIRCUIT AND PROGRAM

CROSS-REFERENCE TO RELATED APPLICATION

This application is based upon and claims the benefit of priority from the prior Japanese Patent Application No. 2013-179746 filed on Aug. 30, 2013, the entire contents of which are incorporated herein by reference.

FIELD

Exemplary embodiments of the present disclosure are related to a method for designing semiconductor integrated circuit and a program thereof.

BACKGROUND

Configuration information of a circuit may be written into a semiconductor integrated circuit to implement functionality in a reconfigurable semiconductor integrated circuit such as FPGA (Field-Programmable Gate Array).

The reconfigurable semiconductor integrated circuit includes a CLB (Configurable Logic Block) provided with a plurality of basic logic elements, a SB (Switch Block), a CB (Connection Block) and a wiring portion connecting these components with each other. The semiconductor integrated circuit equipped with these components is adapted to programmably connect the CLB such that a wiring length is relatively longer and a wiring capacitance is relatively larger compared to the ASIC (Application Specific Integrated Circuit). Therefore, power consumption of the wiring portion tends to be large.

There is an electrical charge recycling technique as a power saving technique applied to the field of the ASIC. In a logical circuit, when a signal value is changed from "1" to "0", all the electrical charge charged in the wiring capacitor is discharged, and power of $CV_{DD}^2/2$ is consumed where the value of the wiring capacitance is C and the power supply voltage is $V_{DD}$. In contrast, in the electrical charge recycling technique, when the charged electrical charge is discharged, some of the electrical charge is stored in a separate capacitor and then, the electrical charge is reused later when the signal value is changed from "0" to "1" so as to reduce the power consumption.

Further, there is a clock resonance scheme as a type of the electrical charge recycling technique. In the clock resonance scheme, an inductor is added to a clock wiring network and an LC resonance circuit is implemented to be resonated by the inductance of the inductor and the capacitance of the clock wiring. Accordingly, electrical charge is reused between the inductor and the capacitor of the clock wiring to reduce the power of the clock wiring network.

See, for example, Japanese Patent Laid-Open Publication No. 2001-195163 and Japanese Patent Laid-Open Publication No. 2011-250107.

See, for example, non-patent literature 1: S. Chan, K. Shepard, and P. Restle, "Uniform-phase uniform-amplitude resonant-load global clock distributions", Solid-State Circuits, IEEE Journal of, vol. 40, no. 1, pp. 102-109, January 2005; and non-patent literature 2: L. McMurchie and C. Ebeling, "Pathfinder: A negotiation-based performance-driven router for fpgas", in ACM/SIGDA International Symposium on Field Programmable Gate Arrays, Monterey, Calif., USA, 1995, pp. 111-117.

However, when the conventional electrical charge recycling technique as described above is intended to be applied to the semiconductor integrated circuit to reduce the power consumption, the timing constraints may not be satisfied due to the increase of the delay time caused by the transfer of the electrical charge.

SUMMARY

According to one aspect of the present disclosure, there is provided a method for designing a semiconductor integrated circuit which includes determining, by a designing device, a first wiring over which a signal is propagated and a second wiring which is not used for a propagation of the signal among a plurality of wirings of a semiconductor integrated circuit; and determining, by the designing device, the second wiring to be used as a wiring for storing electrical charge for an electrical charge recycling of the first wiring using the most number of the first wiring in a range that satisfies a timing constraint based on an operation rate of the signal propagated in the first wiring and a delay time of the first wiring.

Further, according to another aspect of the present disclosure, there is provided a computer-readable recording medium storing a program that, when executed, causes a computer to perform a method for designing a semiconductor integrated circuit. The method includes: determining, by a designing device, a first wiring over which a signal is propagated and a second wiring which is not used for a propagation of the signal among a plurality of wirings of a semiconductor integrated circuit; and determining, by the designing device, the second wiring to be used as a wiring for storing electrical charge for an electrical charge recycling of the first wiring using the most number of the first wiring in a range that satisfies a timing constraint based on the operation rate of the signal propagated in the first wiring and a delay time of the first wiring.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a view illustrating a portion of a method for designing a semiconductor integrated circuit according to a first embodiment.

DESCRIPTION OF EMBODIMENTS

Figure 2:
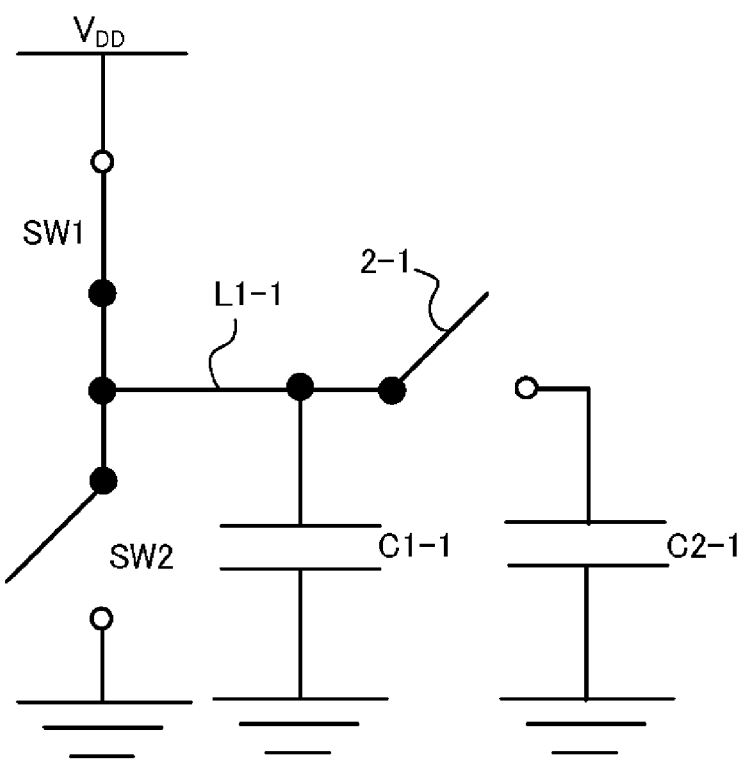
FIG. 2 is a view for explaining an electrical charge recycling by the semiconductor integrated circuit according to the present embodiment (first view).

Hereinafter, descriptions will be made on exemplary embodiments with reference to accompanying drawings.

First Embodiment

FIG. 1 is a view illustrating a portion of a method for designing a semiconductor integrated circuit according to a first embodiment.

In the routing process (step S1), the designing device (e.g., the designing device 100 of FIG. 18 to be described below) determines a first wiring in which a signal is propagated and a second wiring which is not used for a propagation of the signal among a plurality of wirings of a semiconductor integrated circuit.

In a selection process of the electrical charge recycling-enabling/disabling (step S2), the designing device determines the second wiring to be used as a wiring for storing electrical charge for an electrical charge recycling of the first wiring using the most number of the first wirings in a range that satisfies a timing constraint based on the operation rate of the signal propagated in the first wiring and a delay time of the first wiring.

As in the example of FIG. 1, the semiconductor integrated circuit 1 which is to be designed is the reconfigurable semiconductor integrated circuit such as FPGA and includes a plurality of wirings L1-1, L2-1, . . . , L1-n, L2-n. In the processing of step S1, the wiring to be used for the propagation of signal and the wiring not to be used for the propagation of signal among the plurality of wirings L1-1, L2-1, . . . , L1-n, L2-n are determined.

In the example of FIG. 1, the signals $V_{IN1}$ and $V_{INn}$ are propagated in the wirings L1-1 and L1-n, respectively, but the signals are not propagated in the wirings L2-1 and L2-n, and the wirings L2-1 and L2-n are remained as reserved wirings (unused wirings). A determination is made as to which wiring is to be used for the propagation of signal or which wiring is not to be used for the propagation of signal based on a delay time of the wiring, a slack ratio (a value indicating whether the timing includes a margin) of the signal based on the delay time and the operation rate of the signal. An exemplary method of determining the wirings to be used or not to be used for the propagation of signal will be described later.

The semiconductor integrated circuit 1 further includes switches 2-1 to 2-n that electrically connect or disconnect the wirings L1-1 to L1-n and the unused wirings L2-1 to L2-n, and electrical charge recycling control circuits 3-1 to 3-n that control the switches 2-1 to 2-n.

The electrical charge recycling control circuits 3-1 to 3-n control the switches 2-1 to 2-n based on the potential of the signals $V_{IN1}$ to $V_{INn}$ propagated in the wirings L1-1 to L1-n. Also, the electrical charge recycling control circuits 3-1 to 3-n transfer some of electrical charge charged in the wiring capacitors C1-1 to C1-n of the wirings L1-1 to L1-n to the wiring capacitors C2-1 to C2-n of the reserved wirings L2-1 to L2-n to be stored in the wiring capacitors C2-1 to C2-n. Further, when the wiring capacitors C1-1 to C1-n are charged, the electrical charge recycling control circuits 3-1 to 3-n introduce electrical charge stored in the wiring capacitors C2-1 to C2-n into the wiring capacitors C1-1 to C1-n to reuse for charging the wiring capacitors C1-1 to C1-n. Further, the electrical charge recycling control circuits 3-1 to 3-n also have a functionality of a buffer circuit, and maintain and output the signals $V_{IN1}$ to $V_{INn}$. Further, the wiring capacitors C1-1 to C1-n, C2-1 to C2-n are parasitic capacitors and thus, represented in a dotted line in FIG. 1.

For example, when the signal $V_{IN1}$ is changed from "1" (the potential level is H (High) level) to "0" (the potential level is L (Low) level), the electrical charge recycling control circuit 3-1 turns ON the switch 2-1 for a predetermined time. Accordingly, some electrical charge charged in the wiring capacitor C1-1 of the wiring L1-1 are transferred to and stored in the wiring capacitor C2-1 of the unused wiring L2-1 in a flow indicated by an arrow a1 in FIG. 1.

When the signal $V_{IN1}$ is changed from "0" to "1", the electrical charge recycling control circuit 3-1 also turns ON the switch 2-1 for a predetermined time. Accordingly, some electrical charge stored in the wiring capacitor C2-1 of the wiring L2-1 are introduced into and charged in the wiring capacitor C1-1 of the wiring L1-1 in a flow indicated by an arrow a2 in FIG. 1.

However, when the electrical charge recycling is performed, there is a concern that the delay increases and thus, the timing constraints may not be satisfied. Therefore, in the processing of step S2, the wirings L2-1 to L2-n are determined to be used as wirings for storing electrical charge for an electrical charge recycling of the wirings L1-1 to L1-n using the most number of wirings L1-1 to L1-n in a range that satisfies a timing constraint.

The determination is made based on the operation rate of the signal propagated in the wirings L1-1 to L1-n and the delay time of the wirings L1-1 to L1-n. For example, the wiring having a large operation rate of signal is set to use the wiring for storing electrical charge so as to reduce the power consumption (the electrical charge recycling is enabled). The wiring having a large delay may not satisfy the timing constraint and thus the wiring having a large delay is set to not use as the wiring for storing electrical charge (the electrical charge recycling is disabled). Also, the wiring for storing electrical charge for an electrical charge is caused to be used using the most number of the wirings L1-1 to L1-n in a range that satisfies the timing constraint, such that the timing constraint is satisfied and also powers are reduced as much as possible.

Further, when the electrical charge recycling is intended to be disabled, for example, the electrical charge recycling control circuits 3-1 to 3-n are set to always turn OFF the switches 2-1 to 2-n. Hereinbelow, an example of operations of the semiconductor integrated circuit 1 of FIG. 1 will be described.

Figure 3:
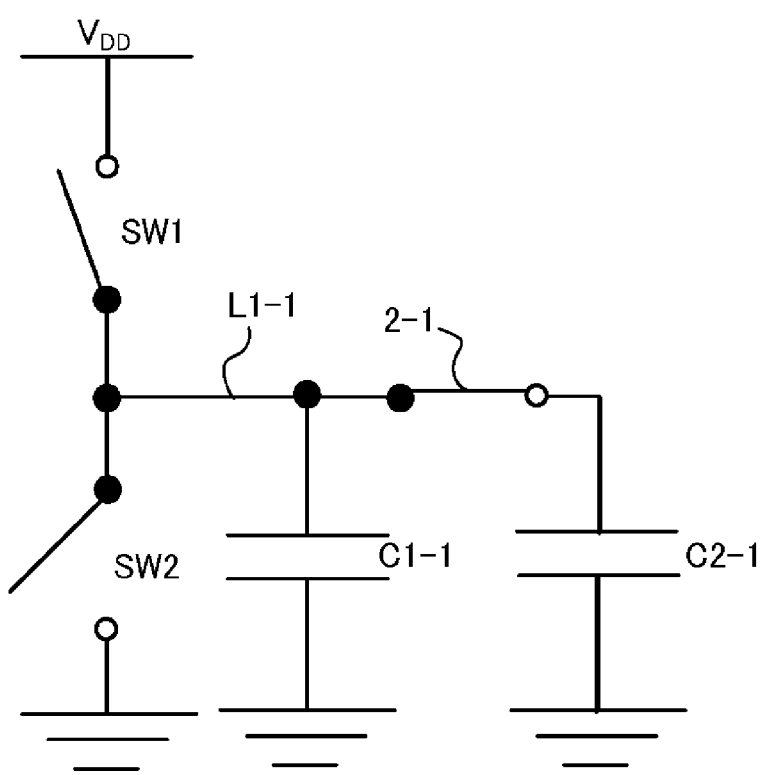
FIG. 3 is a view for explaining the electrical charge recycling by the semiconductor integrated circuit according to the present embodiment (second view).
Figure 4:
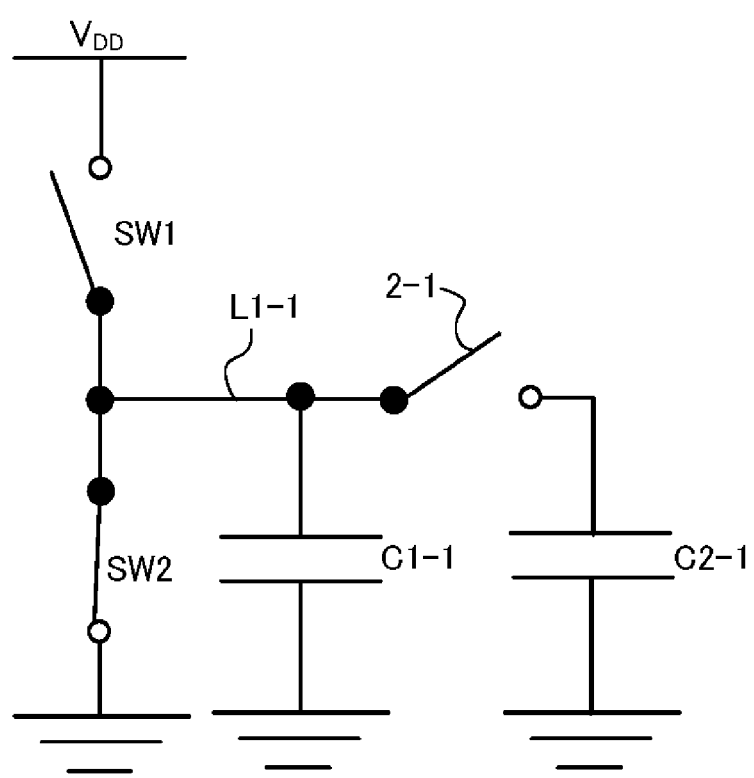
FIG. 4 is a view for explaining the electrical charge recycling by the semiconductor integrated circuit according to the present embodiment (third view).

FIG. 2, FIG. 3 and FIG. 4 are views for explaining an electrical charge recycling by the semiconductor integrated circuit according to the present embodiment. The switches SW1 and SW2, the switch 2-1 and the wiring capacitors C1-1 and C2-1 of the wirings L1-1 and L2-1 illustrated in FIG. 1 are illustrated in FIG. 2, FIG. 3 and FIG. 4. The switches SW1 and SW2 are implemented by the electrical charge recycling control circuit 3-1 and serve to connect (to be grounded) the wiring L1-1 to the power supply (which supplies the power supply voltage $V_{DD}$) or the GND (a reference power supply), or disconnect the wiring L1-1 from the power supply or the GND. Similar operations may be applied to other switch 2-n and the electrical charge recycling control circuit 3-n illustrated in FIG. 1.

The power supply voltage $V_{DD}$ is applied to one terminal of the switch SW1 and one terminal of the switch SW2 is connected to the other terminal of the switch SW1. The other terminal of the switch SW2 is grounded. One terminal of the wiring capacitor C1-1 and one terminal of the switch 2-1 are connected to a node between the switch SW1 and the switch SW2.

The other terminal of the switch 2-1 is connected to one terminal of the wiring capacitor C2-1. The other terminals of the wiring capacitors C1-1 and C2-1 are grounded.

In FIG. 2, a state of the semiconductor integrated circuit 1 when the signal VIN1 is "1" is schematically illustrated. The switch SW1 is in an ON state and the switches SW2 and 2-1 are in an OFF state, and electrical charge is charged into the wiring capacitor C1-1 by the power supply voltage $V_{DD}$.

In FIG. 3, a state of the semiconductor integrated circuit 1 right after the signal VIN1 is changed from "1" to "0" is schematically illustrated. The switches SW1 and SW2 are turned OFF and the switch 2-1 is turned ON and thus, some of electrical charge charged in the wiring capacitor C1-1 is transferred to the wiring capacitor C2-1, and the voltage of the wiring L1-1 becomes stable at the time when the voltage reaches a certain value (hereinafter, this value is denoted by a voltage $V_{INT\_HIGH}$).

In FIG. 4, a state of the semiconductor integrated circuit 1 after the signal $V_{IN1}$ is changed "0" and then the voltage of the wiring L1-1 is stabilized is schematically illustrated. The switch SW1 2-1 is in an OFF state and the switch SW2 is in an ON state, and electrical charge charged in the wiring capacitor C1-1 is discharged.

Figure 5:
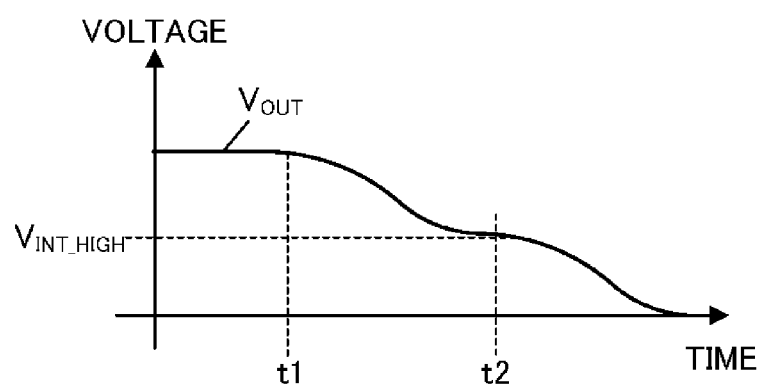
FIG. 5 is a view illustrating an example of a voltage waveform of a wiring L1-1 when a signal $V_{IN}1$ is changed from "1" to "0".

FIG. 5 is a view illustrating an example of a voltage waveform of a wiring L1-1 when the signal $V_{IN1}$ is changed from "1" to "0". The horizontal axis represents a time and the vertical axis represents a voltage. When the signal $V_{IN1}$ is changed from "1" to "0", the voltage $V_{OUT}$ of the wiring L1-1 begins to decrease from timing t1. At this time, the switch 2-1 is turned ON under the control of the electrical charge recycling control circuit 3-1 and the state of the semiconductor integrated circuit 1 becomes the state illustrated in FIG. 3. At timing t2 where the voltage $V_{OUT}$ reaches the voltage $V_{INT\_HIGH}$, the switch 2-1 is turned OFF under the control of the electrical charge recycling control circuit 3-1 and the state of the semiconductor integrated circuit 1 becomes the state illustrated in FIG. 4 where discharge is performed.

As described above, when the signal $V_{IN1}$ is changed from "1" to "0", some of electrical charge charged in the wiring capacitor C1-1 are stored in the wiring capacitor C2-1 and the electrical charge amount discharged at the time of discharge of the wiring capacitor C1-1 is reduced and thus, the power consumption may be reduced.

In the meantime, when the signal $V_{IN1}$ is changed from "0" to "1", a state of the semiconductor integrated circuit is changed from the state illustrated in FIG. 4 to the state illustrated in FIG. 3. Accordingly, some of electrical charge stored in the wiring capacitor C2-1 is transferred to the wiring capacitor C1-1 and the voltage of the wiring L1-1 becomes stable at the time when the voltage reaches a certain value (hereinafter, this value is denoted by voltage $V_{INT\_LOW}$).

Figure 6:
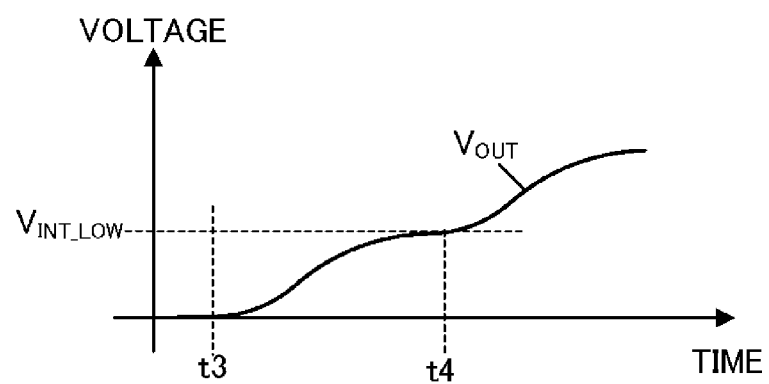
FIG. 6 is a view illustrating an example of the voltage waveform of the wiring L1-1 when a signal $V_{IN}1$ is changed from "0" to "1".

Thereafter, the state of the semiconductor integrated circuit becomes the state illustrated in FIG. 2 and remaining electrical charge is charged in the wiring capacitor C1-1. FIG. 6 is a view illustrating an example of a voltage waveform of the wiring L1-1 when the signal $V_{IN1}$ is changed from "0" to "1". The horizontal axis represents a time and the vertical axis represents a voltage.

The voltage $V_{OUT}$ of the wiring L1-1 begins to increase from timing t3. At this time, the switch 2-1 is turned ON under the control of the electrical charge recycling control circuit 3-1 and the state of the semiconductor integrated circuit 1 becomes the state illustrated in FIG. 3. At timing t4 where the voltage $V_{OUT}$ reaches the voltage $V_{INT\_LOW}$, the switch 2-1 is turned OFF under the control of the electrical charge recycling control circuit 3-1 and the state of the semiconductor integrated circuit 1 becomes the state illustrated in FIG. 1 where charge is performed.

As described above, when the signal $V_{IN1}$ is changed from "0" to "1", some of electrical charge stored in the wiring capacitor C2-1 is transferred to the wiring capacitor C1-1 and the electrical charge amount recharged at the time of recharge of the wiring C1-1 is reduced and thus, the power consumption may be reduced.

The following equations are established from a relationship between voltage and electrical charge in a state before the input signal is changed and a state where the electrical charge are transferred between the wiring capacitors C1-1 and C2-1 (electrical charge storage state at the time when the signal $V_{IN1}$ is changed from "1" to "0, or electrical charge recycling state at the time when the signal $V_{IN1}$ is changed from "0" to "1").

[Equation 1]

$$C_L V_{DD} + C_R V_{INT\_LOW} = C_L V_{INT\_HIGH} + C_R V_{INT\_HIGH} \quad (1)$$

[Equation 2]

$$C_R V_{INT\_HIGH} = C_L V_{INT\_LOW} + C_R V_{INT\_LOW} \qquad (2)$$

In Equation 1 and Equation 2, CL and CR indicate capacitances of the wiring capacitor C1-1 and the wiring capacitor C2-1, respectively. From Equation 1 and Equation 2, the voltage $V_{INT\_LOW}$ and the voltage $V_{INT\_HIGH}$ may be represented by the following Equation 3 and Equation 4, respectively.

[Equation 3]

$$V_{INT\_LOW} = \frac{C_R}{C_L + 2C_R} V_{DD} \qquad (3)$$

[Equation 4]

$$V_{INT\_HIGH} = \frac{C_L + C_R}{C_L + 2C_R} V_{DD} \qquad (4)$$

Further, Energy E consumed when the electrical charge recycling is used, Energy E when the signal $V_{IN1}$ is changed from "1" to "0" using the electrical charge recycling and Energy E when the signal $V_{IN1}$ is changed from "0" to "1" using the electrical charge recycling may be represented by the following Equation 5, Equation 6 and Equation 7, respectively.

(Energy Consumed when Electrical Charge Recycling is not Used)

[Equation 5]

$$E = \frac{1}{2} C_L V_{DD}^2 \qquad (5)$$

(Energy when the Signal $V_{IN1}$ is Changed from "1" to "0" Using the Electrical Charge Recycling)

[Equation 6]

$$E = \frac{1}{2} C_L V_{INT\_HIGH}^2 \qquad (6)$$

(Energy E when the Signal $V_{IN1}$ is Changed from "0" to "1" Using the Electrical Charge Recycling)

[Equation 7]

$$E = \frac{1}{2} C_L (V_{DD} - V_{INT\_LOW})^2 \qquad (7)$$

Since $V_{DD} > V_{INT\_HIGH}$ and $V_{DD} > (V_{DD} - V_{INT\_LOW})$, from Equation 6 and Equation 7, energy consumed when the value of the signal $V_{IN1}$ is changed may be reduced and thus, power consumption may be suppressed according to the semiconductor integrated circuit 1 of the present embodiment in which the electrical charge recycling is utilized.

Further, as illustrated in FIG. 1, the electrical charge recycling control circuits 3-1 to 3-n control the switches 2-1 to 2-n to use the wiring capacitors C2-1 to C2-n of the reserved wirings L2-1 to L2-n) and thus, a redundant capacitor for the electrical charge recycling may not be added. Therefore, the power consumption may be suppressed by using a circuit having a relatively smaller area.

Second Embodiment

Figure 7:
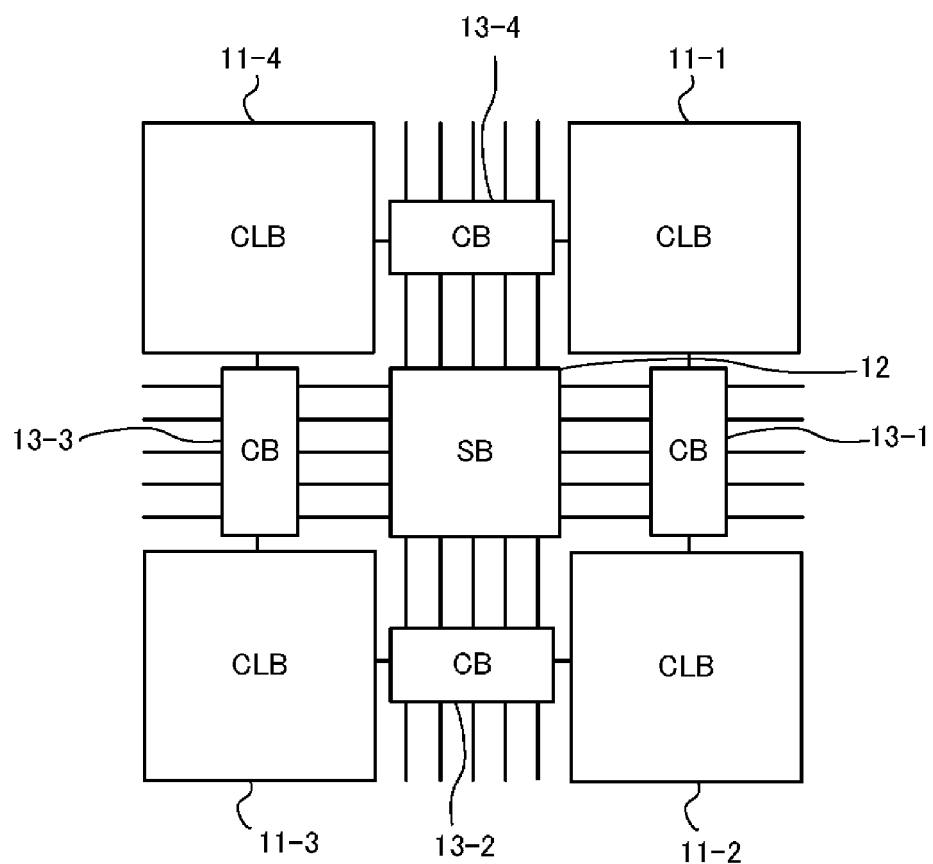
FIG. 7 is a view illustrating an example of a semiconductor integrated circuit (FPGA) according to a second embodiment.

FIG. 7 is a view illustrating an example of a semiconductor integrated circuit (FPGA) according to a second embodiment. The FPGA 10 includes CLBs 11-1, 11-2, 11-3 and 11-4, a SB 12 and CBs 13-1, 13-2, 13-3 and 13-4.

The CLBs 11-1 to 11-4 are logical circuit blocks each of which is provided with a plurality of basic logic elements. The SB 12 performs switching of connection between vertical wirings and horizontal wirings. The CBs 13-1 to 13-4 connect the CLBs 11-1 to 11-4 with the vertical wirings or horizontal wirings.

(Example of Basic Logic Elements of CLBs 11-1 to 11-4)

Figure 8:
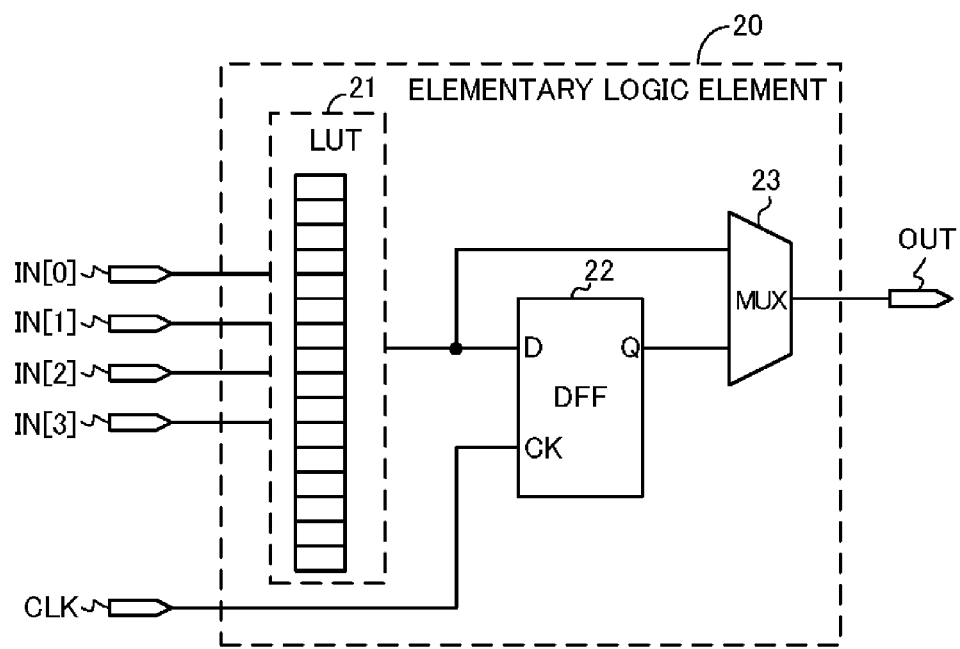
FIG. 8 is a view illustrating an example of a basic logic element of a CLB.

FIG. 8 is a view illustrating an example of a basic logic element of the CLB. The basic logic element 20 includes a lookup table (LUT) 21, a D type flip-flop (DFF) 22 and a multiplexer (MUX) 23.

The LUT 21 is implemented by, for example, a SRAM (Static Random Access Memory). The LUT 21 receives a four-bit address from four input terminals IN[0], IN[1], IN[2] and IN[3] as an input and outputs 1-bit data from data having stored therein based on the address.

The DFF 22 receives a clock inputted from a clock terminal CLK at its clock CK and receives the output of the LUT 21 as an input at a timing synchronized with the clock to output the input from a terminal Q.

The MUX 23 selects one of the output of the LUT 21 and the output of the DFF 22, and outputs the selected output from an output terminal OUT.

(Example of SB 12)

Figure 9:
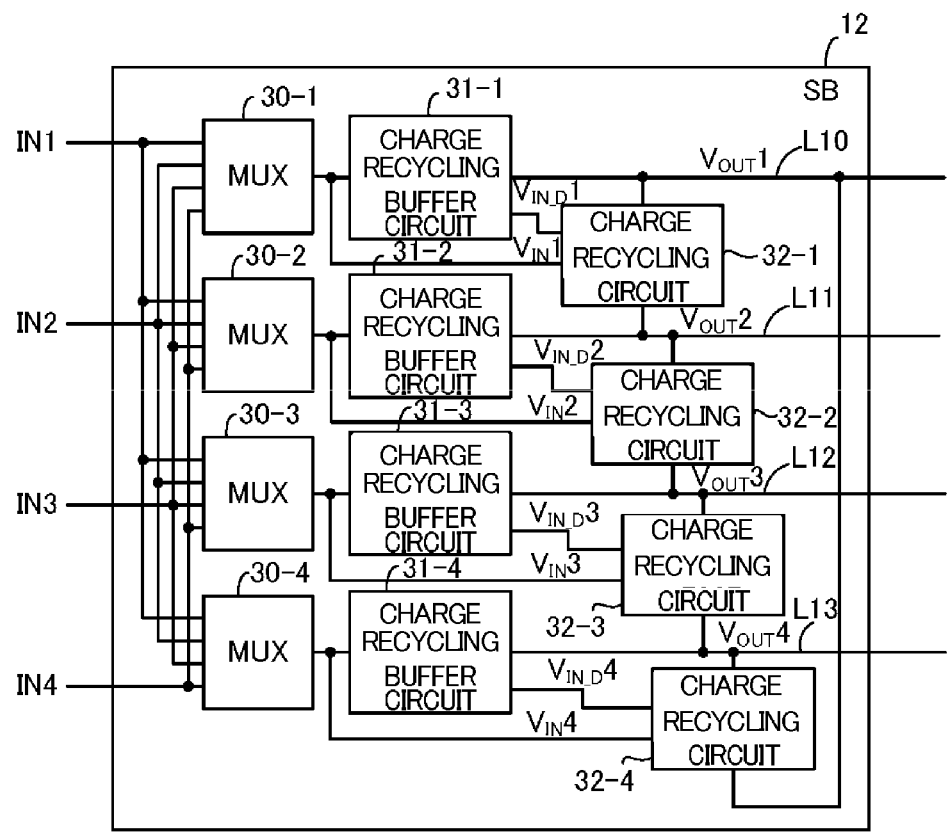
FIG. 9 is a view illustrating an example of a SB.

FIG. 9 is a view illustrating an example of a SB.

In the FPGA 10 of the second embodiment, the SB 12 includes MUXs 30-1, 30-2, 30-3 and 30-4, electrical charge recycling buffer circuits 31-1, 31-2, 31-3 and 31-4 and electrical charge recycling circuits 32-1, 32-2, 32-3 and 32-4. Further, an example of a name of signal transmitted by the wiring in some of respective wirings is denoted in FIG. 9.

The MUXs 30-1 to 30-4 select one of the four input signals IN1, IN2, IN3 and IN4 to output the selected signal as one of signals $V_{IN1}$, $V_{IN2}$, $V_{IN3}$ and $V_{IN4}$. The control signal of the MUXs 30-1 to 30-4 is supplied from, for example, a SRAM cell provided for configuration (not illustrated).

The electrical charge recycling buffer circuits 31-1 to 31-4 perform some of functions of the charge recycling control circuits 3-1 to 3-n of FIG. 1 described above. The electrical charge recycling buffer circuits 31-1 to 31-4 maintain and output the signals $V_{IN1}$ to $V_{IN4}$ to the wirings L10, L11, L12 and L13 as the signals $V_{OUT1}$, $V_{OUT2}$, $V_{OUT3}$ and $V_{OUT4}$. Further, the electrical charge recycling buffer circuits 31-1 to 31-4 generate the signals $V_{IN\_D1}$, $V_{IN\_D2}$, $V_{IN\_D3}$ and $V_{IN\_D4}$ from the signals $V_{IN1}$ to $V_{IN4}$ to supply the signals $V_{IN\_D1}$, $V_{IN\_D2}$, $V_{IN\_D3}$ and $V_{IN\_D4}$ to the electrical charge recycling circuits 32-1 to 32-4 having the function of the switches 2-1 to 2-n. The signals $V_{IN\_D1}$ to $V_{IN\_D4}$ are signals that determine a time period of an electrical charge storing operation and a time period of a charge recycling operation (a time period during which the switch 2-1 is turned ON in the state of FIG. 3).

The electrical charge recycling circuits 32-1 to 32-4 have the function of the switches 2-1 to 2-n illustrated in FIG. 1 and also perform some of functions of the charge recycling control circuit 3. That is, the electrical charge recycling circuits 32-1 to 32-4 electrically connect or disconnect the wiring L10 and the wiring L11, the wiring L11 and the wiring L12, the wiring L12 and the wiring L13, or the wiring L13 and the wiring L10 based on the signals $V_{IN1}$ to $V_{IN4}$ and the signals $V_{IN\_D1}$ to $V_{IN\_D4}$.

In the example of the SB 12 in FIG. 9, a single wiring (reserved wiring) is used as a wiring for storing electrical charge with respect to a single wiring 1 in which the signal is transmitted, and the wiring for storing electrical charge with respect to a certain wiring is fixed. For example, when the wirings L11 and L13 are reserved wirings in which signals are not propagated among the wirings L10 to L13, the wiring L11 is used for storing electrical charge of the wiring L10, and the wiring L13 is used for storing electrical charge of the wiring L12.

Further, in the above example, an adjacent wiring is used as the wiring for storing electrical charge, but is not limited thereto. For example, when the electrical charge recycling circuit 32-1 is connected between the wirings L10 and L12, the wiring L12 is used as the wiring for storing electrical charge of the wiring L10. Further, the charge recycling may be performed between wirings of a plurality of dies using, for example, a three-dimensional mounting technique.

Hereinbelow, an example of the electrical charge recycling buffer circuits 31-1 to 31-4 of the SB 12 will be described.

(Example of Electrical Charge Recycling Buffer Circuits 31-1 to 31-4)

Figure 10:
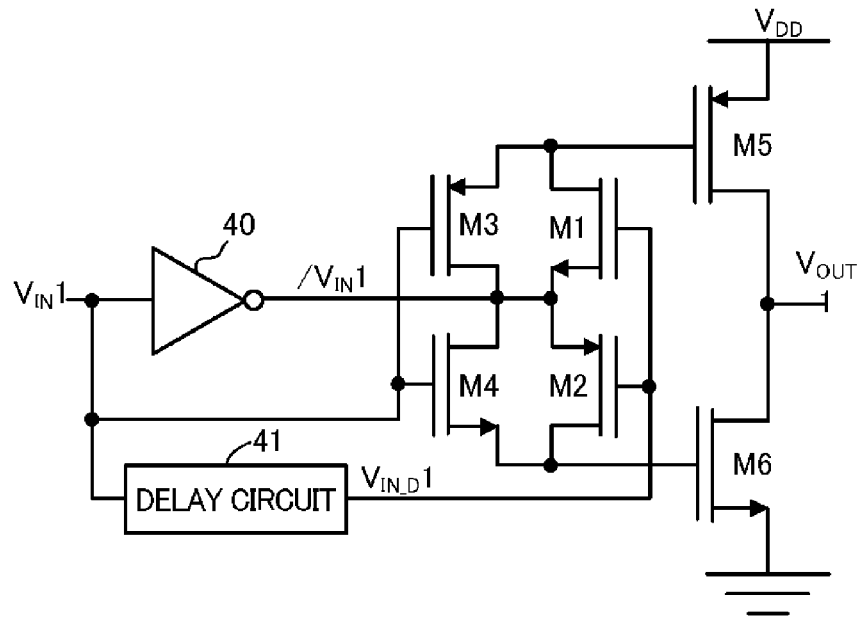
FIG. 10 is a view illustrating an example of an electrical charge recycling buffer circuit.

FIG. 10 is a view illustrating an example of an electrical charge recycling buffer circuit. In the following description, the electrical charge recycling buffer circuit 31-1 illustrated in FIG. 9 is exemplified, but other electrical charge recycling buffer circuits 31-2 to 31-4 may also be implemented by the same circuit as that of the electrical charge recycling buffer circuit 31-1.

The electrical charge recycling buffer circuit 31-1 includes an inverter circuit 40, a delay circuit 41 and transistors M1, M2, M3, M4, M5 and M6. The inverter circuit 40 receives the signal $V_{IN1}$ as an input and outputs the inverted signal $/V_{IN1}$ that a logic level of the signal $V_{IN1}$ is inverted. The delay circuit 41 receives the signal $V_{IN1}$ as an input and outputs the signal $V_{IN\_D1}$ that the signal $V_{IN1}$ is delayed.

Among the transistors M1 to M6, the transistors M1, M4 and M6 are the n-channel type MOSFET (Metal-Oxide Semiconductor Field Effect Transistor) and the transistors M2, M3 and M5 are the p-channel type MOSFET.

The transistors M5 and M6 function as the inverter circuit and the transistors M1 to M4 function as a gating circuit that controls the inverter. The signal $V_{IN\_D1}$ output from the delay circuit 41 is input to the gates of the transistors M1 and M2 and the signal $V_{IN\_D1}$ is input to the gates of the transistors M3 and M4. The signal $N_{IN1}$ outputted from the inverter circuit 40 is input to the sources of the transistors M1 and M2 and the drains of the transistors M3 and M4. Further, the drain of the transistor M1 and the source of the transistor M3 are connected to the gate of the transistor M5. The drain of the transistor M2 and the source of the transistor M4 are connected to the gate of the transistor M6.

The power supply voltage $V_{DD}$ is applied to the source of the transistor M5 and the drain of the transistor M5 is connected to the drain of the transistor M6 in the transistors M5 and M6 that function as the inverter circuit. The source of the transistor M6 is grounded. The potential of the node between the drain of the transistor M5 and the drain of the transistor M6 is output as a signal $V_{OUT1}$.

The gating circuit formed by the transistors M1 to M4 combines with the delay circuit 41 to perform a control that causes the transistors M5 and M6 to be in an OFF state during which electrical charge are transferred to disconnect the wiring L10 from the power supply and the GND in the electrical charge storage state and the charge recycling state.

Next, an example of the delay circuit 41 of the electrical charge recycling buffer circuit 31-1 will be described.

(Example of Delay Circuit 41)

Figure 11:
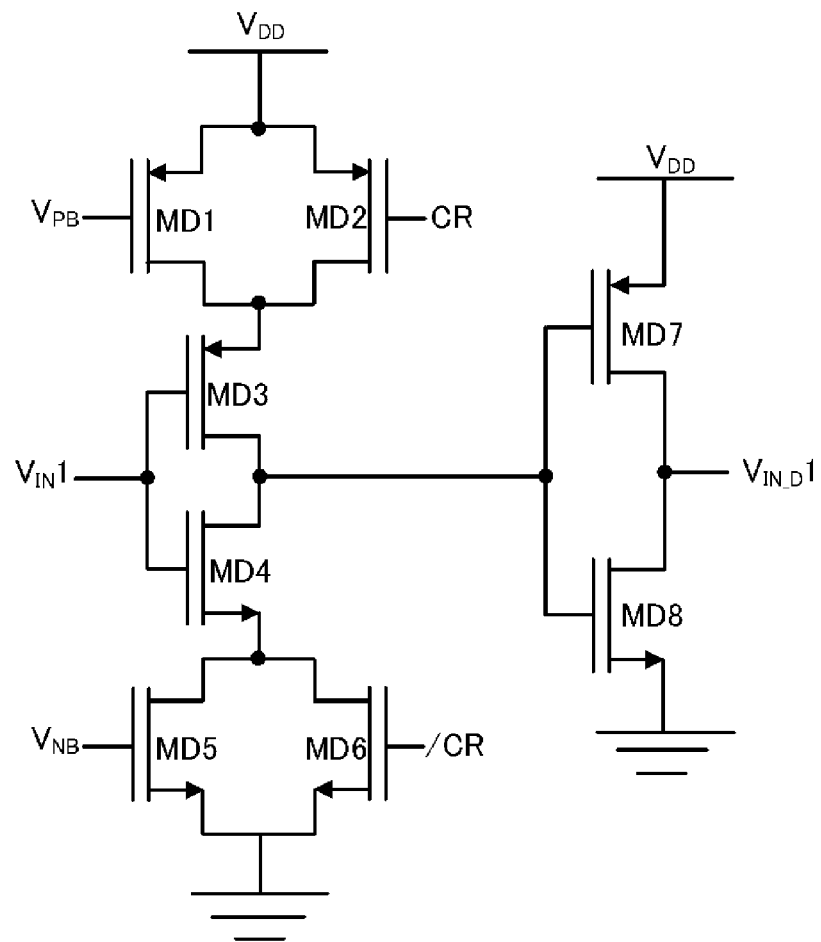
FIG. 11 is a view illustrating an example of a delay circuit.

FIG. 11 is a view illustrating an example of a delay circuit. The delay circuit 41 has a function of delaying the signal $V_{IN1}$ by a time during which electrical charge are transferred in the electrical charge storage state and the charge recycling state. The example of the delay circuit 41 illustrated in FIG. 11 indicates an example in which Current-starved inverter is adopted.

The delay circuit 41 includes transistors MD1, MD2, MD3, MD4, MD5, MD6, MD7 and MD8. Among the transistor MD1 to MD8, the transistors MD1, MD2, MD3 and MD7 are the p-channel type MOSFET and the transistors MD4, MD5, MD6 and MD8 are the n-channel type MOSFET.

The bias voltage $V_{PB}$ is applied to the gate of the transistor MD1 and the signal CR is input to the gate of the transistor MD2. The power supply voltage $V_{DD}$ is applied to the sources of the transistors MD1 and MD2, and the drains of the transistors MD1 and MD2 are connected to the source of the transistor MD3. The drain of the transistor MD3 is connected to the drain of the transistor MD4 and also to the gate of the transistors MD7 and MD8. The signal $V_{IN1}$ is input to the gates of the transistors MD3 and MD4, and the source of the transistor MD4 is connected to the drains of the transistors MD5 and MD6. The bias voltage $V_{NB}$ is applied to the gate of the transistor MD5, and the inverted signal /CR that the logic level of the signal CR is inverted is input to the gate of the transistor MD6. The sources of the transistors MD5 and MD6 are grounded.

The transistors MD7 and MD8 function as the inverter circuit, and the power supply voltage $V_{DD}$ is applied to the source of the transistor MD7, and the drain of the transistor MD7 is connected to the drain of the transistor MD8. The source of the transistor MD8 is grounded. The potential of the node between the drain of the transistor MD7 and the drain of the transistor MD8 is output as the signal $V_{IN\_D1}$.

In the delay circuit 41 described above, a value of clamp current may be adjusted to adjust delay and thus, the delay time may be adjusted to be conformed to a transfer time of electrical charge. The delay time may be set such that a time period spanning from a time that change begins at the time when the signal $V_{IN1}$ goes down to a time that the signal $V_{OUT1}$ reaches a voltage $V_{INT\_HIGH}$ and also a time period spanning from a time that change begins at the time when the signal $V_{IN1}$ goes up to a time that the signal $V_{OUT1}$ reaches a voltage $V_{INT\_LOW}$. Therefore, it is desirable that the time period is obtained in advance and the delay time is set to be shorter as much as possible so as to satisfy the timing constraints. Further, even when the delay time is set to be shorter than the time period during which the signal $V_{OUT1}$ reaches the voltage $V_{INT\_HIGH}$ or the voltage $V_{INT\_LOW}$, only the power to be reduced is reduced and a logical operation is not affected by the setting of the delay time.

Further, the presence or absence of delay may be set using the signal CR in the delay circuit 41. When the value of the signal CR is set to "1" at the time of enabling the charge recycling, the transistors MD2 and MD6 are turned OFF. At this time, the transistors MD1 and MD5 are operated as a clamp current source. The current of the transistors MD1 and MD5 is restricted by the bias voltages $V_{PB}$ and $V_{NB}$ applied to the gates of the transistors MD1 and MD5, thereby causing occurrence of the delay.

When the signal CR is "0", the transistors MD2 and MD6 are turned ON and the occurrence of the delay by the clamp current source by the transistors MD1 and MD5 is cancelled and as a result, the charge recycling operation is not performed.

As described above, in the delay circuit 41, the delay functionality is enabled or disabled by the set signal (signal CR) and thus it is possible to set as to whether the charge recycling is to be enabled or disabled. For example, the power consumption becomes large with respect to the wiring in which the signal having a high operation rate is propagated and thus, the charge recycling is enabled to reduce the power consumption. It becomes possible to perform a selection, such as disabling of the charge recycling with respect to the wiring in which signal, that does not satisfy the timing constraints when the delay becomes large, is propagated.

Further, the signal CR is output from, for example, a SRAM cell for configuration (not illustrated). The SRAM cell for configuration is set based on, for example, the charge recycling-enabling/disabling setting value (see, for example, FIG. 25) obtained by a designing method to be described below.

Further, the bias voltages $V_{PB}$ and $V_{NB}$ are the voltage obtained from, for example, a power supply outside of the semiconductor integrated circuit 10 by taking into account the delay time and may be applied to the gates of the transistors MD1 and MD5 through a dedicated power supply pin. Further, the bias voltages $V_{PB}$ and $V_{NB}$ may be generated from a power supply inside of the semiconductor integrated circuit 1.

(Example of Electrical Charge Recycling Circuit 32-1)

Figure 12:
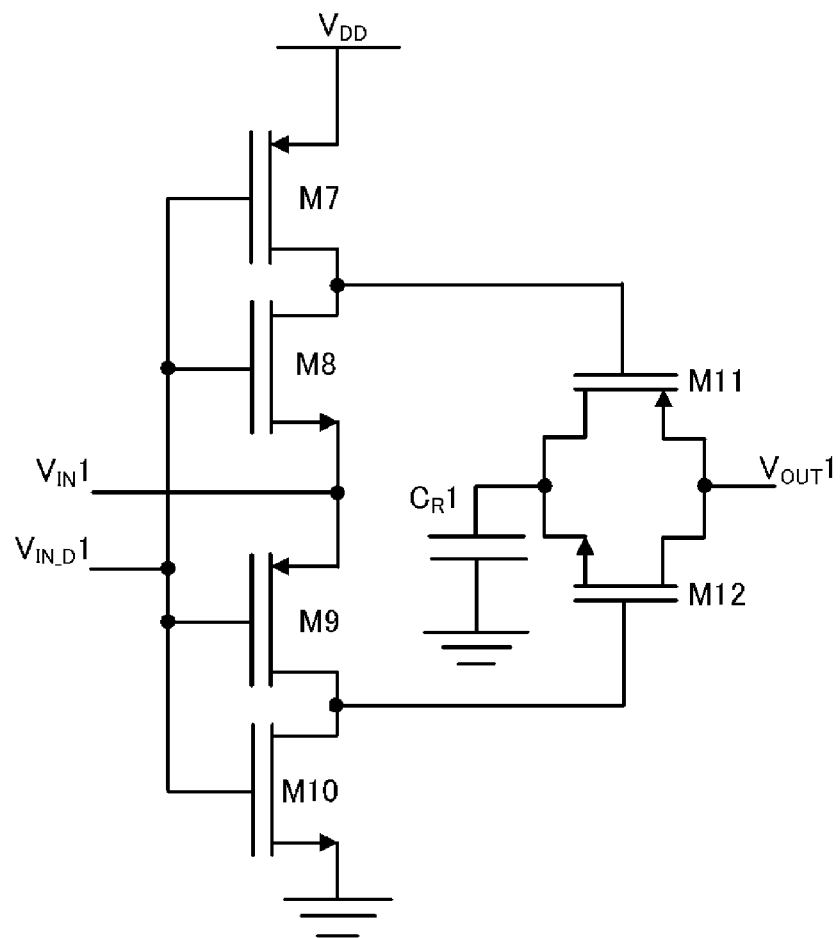
FIG. 12 is a view illustrating an example of an electrical charge recycling circuit.

FIG. 12 is a view illustrating an example of an electrical charge recycling circuit. In the following description, the electrical charge recycling circuit 32-1 illustrated in FIG. 9 is exemplified but other electrical charge recycling circuits 32-2 to 32-4 may also be implemented by the same circuit.

The electrical charge recycling circuit 32-1 has a switching function that connects the wiring L10 and the wiring L11 in the electrical charge recovery state and the charge recycling state. The electrical charge recycling circuit 32-1 includes the transistors M7, M8, M9, M10, M11 and M12. Among the transistors M7 to M12, the transistors M7, M9 and M11 are the p-channel type MOSFET and the transistors M8, M10 and M12 are the n-channel type MOSFET.

The signal $V_{IN\_D1}$ output from the delay circuit 41 described above is input to the gates of the transistors M7 to M10. The power supply voltage $V_{DD}$ is applied to the source of the transistor M7, and the drain of the transistor M7 is connected to the drain of the transistor M8 and the gate of the transistor M11. The source of the transistor M8 and the source of the transistor M9 are connected with each other and the signal $V_{IN1}$ is input to the sources. The drain of the transistor M9 is connected to the drain of the transistor M10 and the gate of the transistor M12. The source of the transistor M10 is grounded.

The transistors M11 and M12 function as a pass transistor. The capacitor $C_R1$ is connected to the drain of the transistor M11 and the source of the transistor M12. The capacitor $C_R1$ is a wiring capacitor of the wiring L11. The signal $V_{OUT1}$ transmitted in the wiring L10 is input to the source of the transistor M11 and the drain of the transistor M12. The pass transistors M11 and M12 perform the function of the switches 2-1 to 2-n illustrated in FIG. 1, and the transistors M7 to M10 perform some of the functions of the charge recycling control circuits 3-1 to 3-n illustrated in FIG. 1.

Hereinbelow, an example of operations of the semiconductor integrated circuit 10 according to the second embodiment will be described.

(Example of Operations of Semiconductor Integrated Circuit 10)

Figure 13:
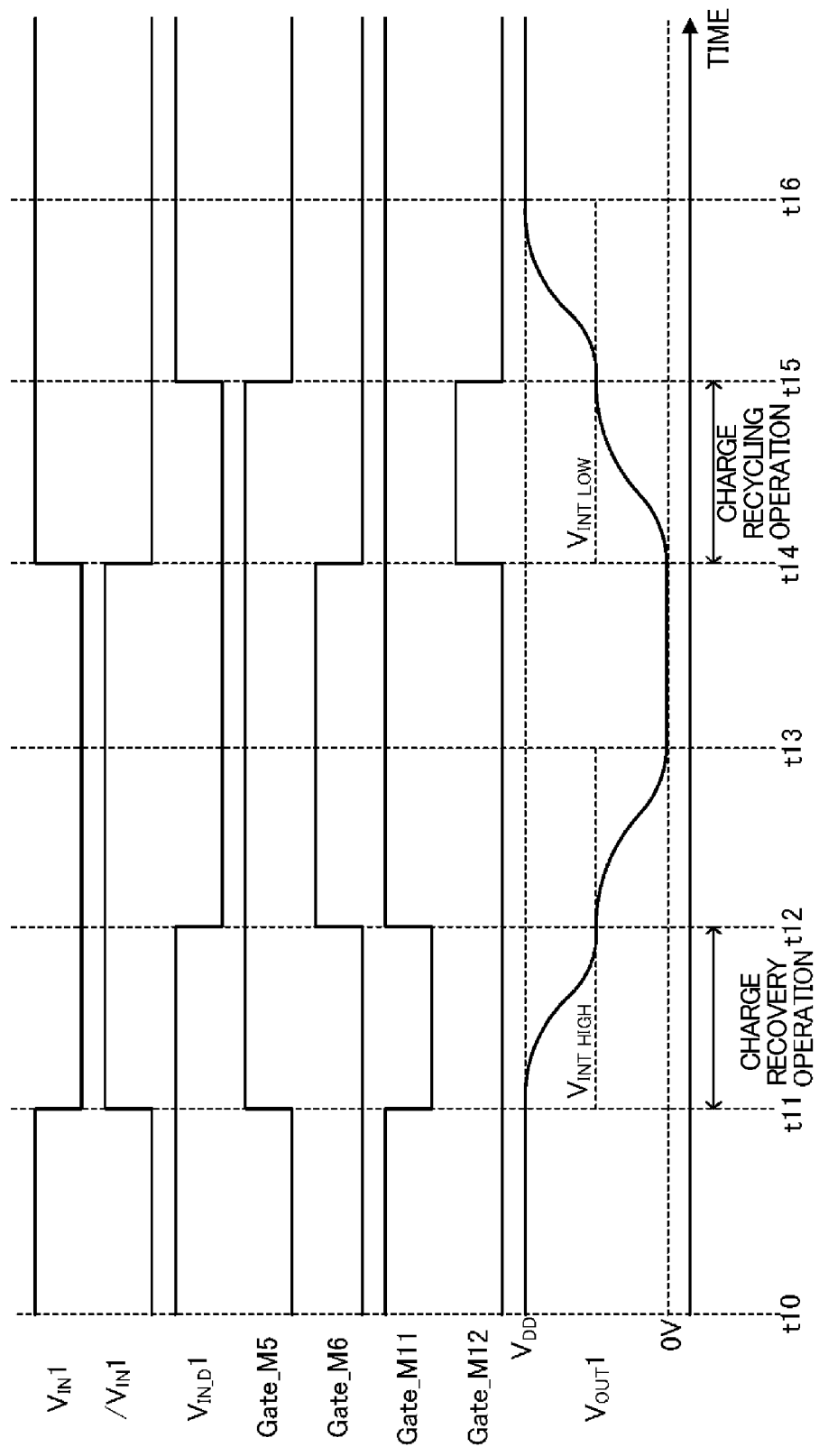
FIG. 13 is a timing chart illustrating an example of operations of the semiconductor integrated circuit.

FIG. 13 is a timing chart illustrating an example of operations of the semiconductor integrated circuit.

Further, in the following, descriptions will be primarily made on the operation of the electrical charge recycling buffer circuit 31-1 and the electrical charge recycling circuit 32-1 under the assumption that the wiring L10 is a wiring in which signal is propagated and the wiring L11 is a reserved wiring in which signal is not propagated. Further, it is assumed that the signal CR that is input to the delay circuit 41 is "1" and the charge recycling is enabled.

In FIG. 13, the states of respective signals $V_{IN1}$, /$V_{IN1}$, $V_{IN\_D1}$ and $V_{OUT1}$ described above are illustrated. Further, a state of the gate voltages Gate_M5 and Gate_M6 of the transistors M5 and M6 of the electrical charge recycling buffer circuit 31-1 and a state of the gate voltages Gate_M11 and Gate_M12 of the transistors M11 and M12 of the electrical charge recycling circuit 32-1 are illustrated.

When the signals $V_{IN1}$ and $V_{IN\_D1}$ are in the H level (timing t10), the transistors M1 and M4 are turned ON and the transistors M2 and M3 are turned OFF in the electrical charge recycling buffer circuit 31-1 of FIG. 10. At this time, since the signal /$V_{IN1}$ is in the L level, the gate voltages Gate_M5 and Gate_M6 of the transistor M5, M6 are in the L level, the transistor M5 is in the ON state and the transistor M6 is in the OFF state. Therefore, the signal $V_{OUT1}$ is in the H level.

In the meantime, when the signals $V_{IN1}$ and $V_{IN\_D1}$ are in the H level, the transistors M7 and M9 are turned OFF, and the transistors M8 and M10 are turned ON in the electrical charge recycling circuit 32-1. Therefore, the gate voltage Gate_M11 becomes the H level, the gate voltage Gate_M12 becomes the L level and both the transistors M11 and M12 are turned OFF, and the wirings L10 and L11 are being electrically disconnected.

When the signal $V_{IN1}$ goes down to the L level (timing t11), the signal $V_{IN\_D1}$ is remaining in the H level due to the delay time by the delay circuit 41 and thus, the transistor M1 maintains the ON state and the transistor M2 maintains the OFF state in the electrical charge recycling buffer circuit 31-1. In the meantime, the transistor M3 is turned ON and the transistor M4 is turned OFF. At this time, since the signal /$V_{IN1}$ is in the H level, the gate voltage Gate_M5 of the transistor M5 becomes the H level and the transistor M5 is turned OFF. In the meantime, the gate voltage Gate_M6 of the transistor M6 is remaining in the L level and the transistor M6 maintains the OFF state.

Accordingly, the wiring L10 becomes a state where the wiring L10 is separated from the power supply as well as GND. In the meantime, since the signal $V_{IN\_D1}$ is remaining in the H level at timing t11, the transistors M7 to M10 maintain the same state as that at timing t10 in the electrical charge recycling circuit 32-1. However, since the signal $V_{IN1}$ becomes the L level, the gate voltage Gate_M11 become the L level and the transistor M11 is turned ON. Accordingly, the wirings L10 and L11 are electrically connected with each other and some of electrical charge charged in the wiring capacitor of the wiring L10 are stored in the wiring capacitor (capacitor CR1) of the wiring L11 through the transistor M11. The potential of the signal $V_{OUT1}$ becomes to decrease due to the transfer of the electrical charge.

When the signal $V_{IN\_D1}$ becomes the L level at timing t12 (timing at which transferring and storing of electrical charge are ended) at which the signal $V_{OUT1}$ reaches the voltage $V_{INT\_HIGH}$, the transistor M1 is turned OFF and the transistor M2 is turned ON in the electrical charge recycling buffer circuit 31-1. Accordingly, the gate voltage Gate_M6 becomes the H level and the transistor M6 is turned ON. Therefore, the wiring L10 is grounded (connected to the GND), electrical charge remained in the wiring capacitor of the wiring L10 are discharged and the potential of the signal VOUT1 is further decreased and thus, discharge is completed at timing t13.

In the meantime, when the signal $V_{IN\_D1}$ becomes the L level at timing t12, the transistors M7 and M9 are turned ON and the transistors M8 and M10 are turned OFF in the electrical charge recycling circuit 32-1. Accordingly, the gate voltage Gate_M11 becomes the H level and the transistor M11 is turned OFF. Therefore, the wirings L10 and L11 become an electrically disconnected state.

Thereafter, when the signal $V_{IN1}$ goes up to the H level (timing t14), the signal VIN_D1 is remaining in the L level and thus, the transistor M1 maintains the OFF state and the transistor M2 maintains the ON state in the electrical charge recycling buffer circuit 31-1. In the meantime, the transistor M3 is turned OFF and the transistor M4 is turned ON. At this time, since the signal $/V_{IN1}$ is in the L level, the gate voltage Gate_M5 of the transistor M5 is remaining in the H level and the transistor M5 maintains the OFF state. In the meantime, the gate voltage Gate_M6 of the transistor M6 becomes the L level and the transistor M6 is turned OFF.

Accordingly, the wiring L10 becomes a state of being separated from the power supply as well as the GND. In the meantime, since the signal $V_{IN\_D1}$ is remaining in the L level at timing t14, the transistors M7 to M10 maintain the same state as that at timing t12 in the electrical charge recycling circuit 32-1. However, the signal $V_{IN1}$ becomes the H level and thus, the gate voltage Gate_M12 $V_{IN1}$ becomes the H level and the transistor M12 $V_{IN1}$ is turned ON. Accordingly, the wiring L10 and the wiring L11 are electrically connected with each other and some of electrical charge charged in the wiring capacitor (capacitor $C_R1$) of the wiring L11 begins to be charged in the wiring capacitor of the wiring L10 through the transistor M12, and the charge recycling operation begins. Further, the potential of the signal $V_{OUT1}$ begins to increase due to the transfer of electrical charge.

When the signal $V_{IN\_D1}$ becomes the H level at timing t15 at which the signal $V_{OUT1}$ reaches the voltage $V_{INT\_LOW}$, the transistor M1 is turned ON and the transistor M2 is turned OFF in the electrical charge recycling buffer circuit 31-1. Accordingly, the gate voltage Gate_M5 becomes the L level and the transistor M5 is turned ON. Therefore, the power supply voltage $V_{DD}$ is applied to the wiring L10, the wiring capacitor of the wiring L10 is further charged, and the potential of the signal $V_{OUT1}$ is further increased and charging is completed at timing t16.

In the meantime, when the signal $V_{IN\_D1}$ becomes the L level at timing t15, the transistors M7 and M9 are turned OFF and the transistors M8 and M10 are turned ON in the electrical charge recycling circuit 32-1. Accordingly, the gate voltage Gate_M12 becomes the L level and the transistor M12 is turned OFF. Therefore, the wirings L10 and L11 become an electrically disconnected state.

As illustrated in FIG. 13, when the signal $V_{IN1}$ is changed from the H level to the L level (from "1" to "0"), some of electrical charge charged in the wiring capacitor of the wiring L10 are stored in the wiring capacitor of the wiring L11 that is the reserved wiring between timing t11 and timing t12. Therefore, the voltage is changed from the voltage $V_{INT\_HIGH}$ to the 0 V at the time of discharging of the wiring L10 and the power consumption is reduced.

When the signal $V_{IN1}$ is changed from the L level to the H level (from "0" to "1"), some of electrical charge stored in the wiring capacitor of the wiring L11 are charged in the wiring capacitor of the wiring L10 between timing t14 and timing t15. Therefore, the voltage is changed from the voltage $V_{INT\_LOW}$ to the power supply voltage $V_{DD}$ at the time of charging of the wiring L10 and the power consumption is reduced.

For example, when the lengths of the wirings L10 and L11 are identical to each other, it becomes that $C_L = C_R$ in Equation 3 and Equation 4 described above. Therefore, Equation 3 and Equation 4 may be represented by the following Equation 8 and Equation 9, respectively.

[Equation 8]
$$V_{INT\_LOW} = \frac{1}{3}V_{DD} \qquad (8)$$

[Equation 9]
$$V^2_{INT\_HIGH} = \frac{2}{3}V_{DD} \qquad (9)$$

Since the consumption energy may be represented by Equation 6 and Equation 7, the consumption energy becomes $2C_L V_{DD}^2/9$ even when the signal $V_{IN1}$ is changed from "1" to "0" as well as the signal $V_{IN1}$ is changed from "0" to "1". When the charge recycling is not used (the voltage is changed from 0 V to the power supply voltage $V_{DD}$ at the time of charging or discharging), the consumption energy by performing the electrical charge reuse becomes $C_L V_{DD}^2/2$ and thus, power reduction efficiency is about 4/9 (56%).

Further, in the semiconductor integrated circuit 10 of the present embodiment, the charge recycling is performed using the wiring capacitor of the reserved wiring (the wiring L11 in the example) and thus, the power consumption may be suppressed due to a small area.

Further, in the above description, descriptions have been made on a case where the wiring used for storing electrical charge is fixed as illustrated in FIG. 9, but the wiring used for storing electrical charge may be changed or a plurality of reserved wirings may be used for storing electrical charge of a single wiring. Hereinbelow, another example of the SB will be described.

(Another Example of SB)

Figure 14:
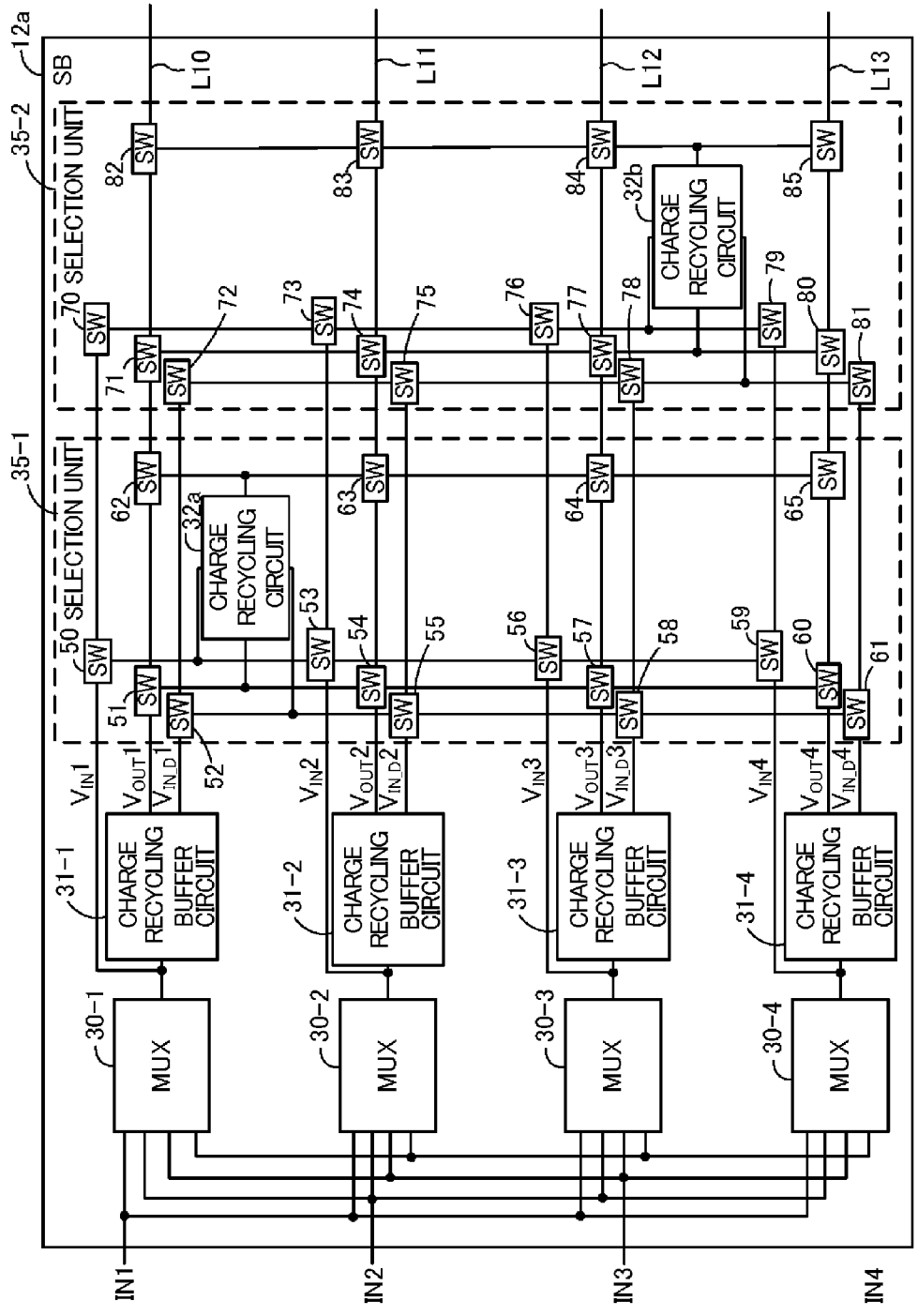
FIG. 14 is a view illustrating another example of the SB.

FIG. 14 is a view illustrating another example of the SB. The components of the SB that are the same as those of the SB 12 illustrated in FIG. 9 are denoted by the same reference numerals.

A SB 12a includes a selection unit 35-1 selecting a wiring that uses the electrical charge recycling circuit 32a and a selection unit 35-2 selecting a wiring that uses the electrical charge recycling circuit 32b. The SB 12a is adapted to use the electrical charge recycling circuits 32a and 32b using any combination of the wirings. The electrical charge recycling circuits 32a and 32b may be configured by the same circuit as that of the electrical charge recycling circuit 32-1 illustrated in FIG. 12.

The selection unit 35-1 includes switches SWs 50, 51, 52, 53, 54, 55, 56, 57, 58, 59, 60, 61, 62, 63, 64 and 65. The switches 50 to 61 select the signal to be input to the electrical charge recycling circuit 32a among the signals $V_{IN1}$ to $V_{IN4}$, $V_{IN\_D1}$ to $V_{IN\_D4}$ and $V_{OUT1}$ to $V_{OUT4}$. The switches 62 to 65 are switches that select the wiring to be used as the reserved wiring for storing electrical charge among the wirings L10 to L13.

The selection unit 35-2 includes switches 70, 71, 72, 73, 74, 75, 76, 77, 78, 79, 80, 81, 82, 83, 84 and 85. The switches 70 to 81 select the signal to be input to the electrical charge recycling circuit 32b among the signals $V_{IN1}$ to $V_{IN4}$, $V_{IN\_D1}$ to $V_{IN\_D4}$ and $V_{OUT1}$ to $V_{OUT4}$. The switches 82 to 85 are switches that select the wiring to be used as the reserved wiring for storing electrical charge among the wirings L10 to L13.

Figure 15:
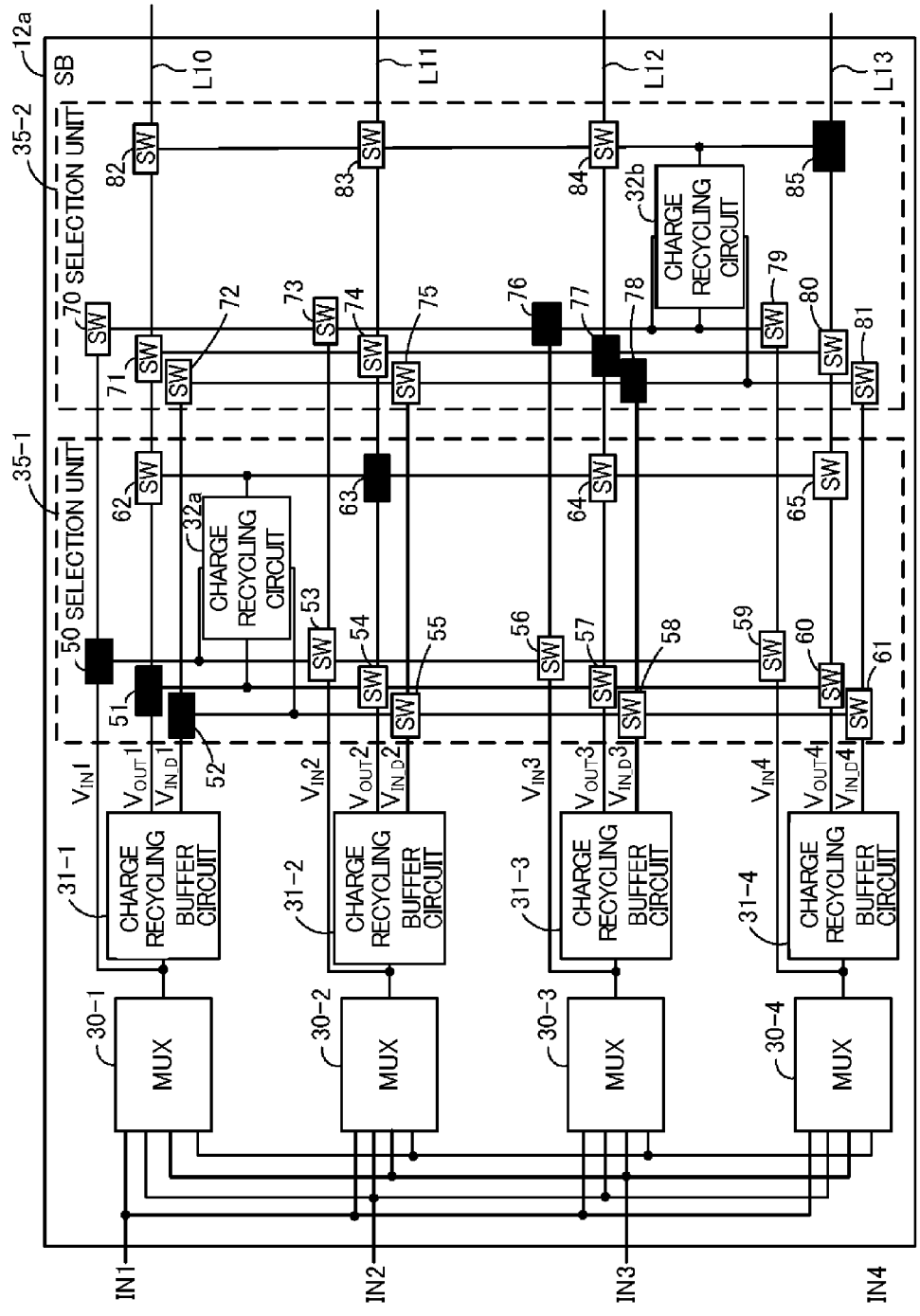
FIG. 15 is a view illustrating an example of settings of a switch when a reserved wiring is used.

Turing ON/OFF of the switches 50 to 65 and switches 70 to 85 are controlled based on the settings stored in, for example, the SRAM cell provided for configuration (not illustrated). FIG. 15 is a view illustrating an example of settings of a switch when any one reserved wiring is used.

In the example of FIG. 15, an example of setting of the switches 50 to 65 and switches 70 to 85 is indicated for a case where the wirings L10 and L12 are set as the wirings in which signal is propagated and the wirings L11 and L13 are set as the reserved wiring. The switches 50 to 52, 63, 76 to 78 and 85 illustrated by blacked-out squares are switches performing the connection between the vertical wirings and the horizontal wirings.

According to the settings described above, when the signal $V_{IN1}$ is changed from "1" to "0", some of electrical charge charged in the wiring capacitor of the wiring L10 are stored in the wiring capacitor of the wiring L11 through the switch 51, the electrical charge recycling circuit 32a and the switch 63. At this time, the signal $V_{OUT1}$ goes down to the voltage $V_{INT\_HIGH}$ as illustrated in FIG. 13 and then goes down to 0 V by the discharging. Accordingly, the power consumption at the time of discharging is reduced as described above.

When the signal $V_{IN1}$ is changed from "0" to "1", some of electrical charge stored in the wiring capacitor of the wiring L11 are charged in the wiring capacitor of the wiring L10 through the switch 63, the electrical charge recycling circuit 32a and the switch 51. At this time, the signal $V_{OUT1}$ goes up to the voltage $V_{INT\_LOW}$ as illustrated in FIG. 13 and then, the remaining electrical charge are charged in the wiring capacitor of the wiring L10 and thus, the voltage goes up to the power supply voltage $V_{DD}$. Accordingly, the power consumption at the time of charging is reduced as described above.

Further, when the signal $V_{IN3}$ is changed from "1" to "0", some of electrical charge charged in the wiring capacitor of the wiring L12 are stored in the wiring capacitor of the wiring L13 through the switch 77, the electrical charge recycling circuit 32b and the switch 85. At this time, the signal $V_{OUT3}$ goes down to the voltage $V_{INT\_HIGH}$ similarly to the signal $V_{OUT1}$ illustrated in FIG. 13 and then, goes down to 0 V by discharging. Accordingly, the power consumption at the time of discharging is reduced as described above.

When the signal $V_{IN3}$ is changed from "0" to "1", some of electrical charge stored in the wiring capacitor of the wiring L13 are charged in the wiring capacitor of the wiring L10 through the switch 85, the electrical charge recycling circuit 32b and the switch 77. At this time, the signal $V_{OUT1}$ goes up to the voltage $V_{INT\_LOW}$ as illustrated in FIG. 13 and then, the remaining electrical charge are charged in the wiring capacitor of the wiring L12 and thus, the voltage goes up to the power supply voltage $V_{DD}$. Accordingly, the power consumption at the time of charging is reduced as described above.

Figure 16:
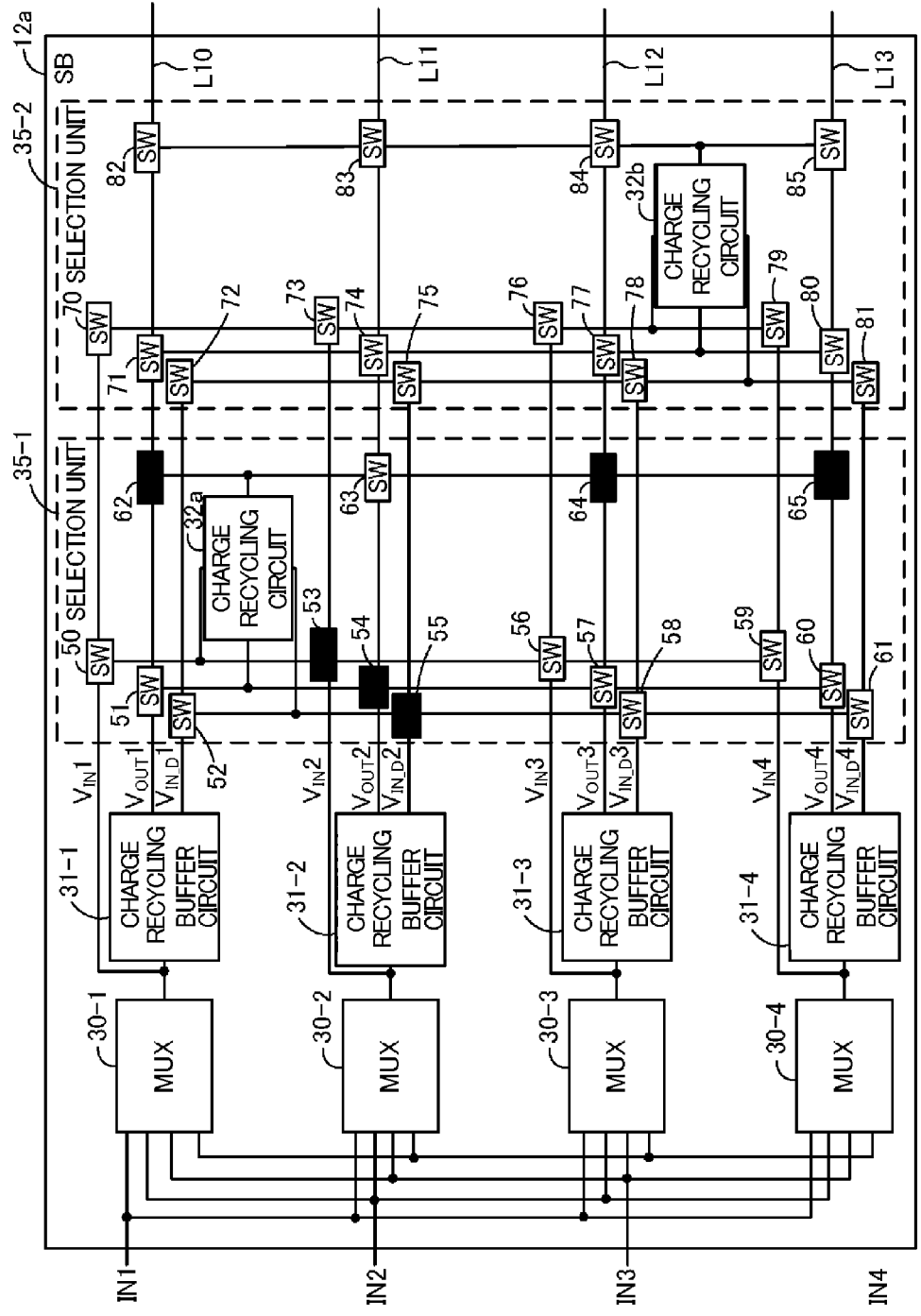
FIG. 16 is a view illustrating an example of settings of the switch when a plurality of reserved wirings is used for storing electrical charge of a single wiring.

FIG. 16 is a view illustrating an example of settings of the switch when a plurality of reserved wirings is used for storing electrical charge of a single wiring. In the example of FIG. 16, an example of setting of the switches 50 to 65 and switches 70 to 85 is indicated for a case where the wiring L11 is set as the wirings in which signal is propagated and other wirings L10, L12 and L13 are set as the reserved wiring. The switches 53 to 55, 62, 64 and 65 illustrated by blacked-out squares are switches performing the connection between the vertical wirings and the horizontal wirings.

According to the settings described above, when the signal $V_{IN2}$ is changed from "1" to "0", some of electrical charge charged in the wiring capacitor of the wiring L11 are stored in the wiring capacitors of the wirings L10, L12 and L13 through the switch 54, the electrical charge recycling circuit 32a and the switches 62, 64 and 65.

At this time, the signal $V_{OUT2}$ goes down to the voltage $V_{INT\_HIGH}$ and then, the voltage goes down to 0 V by discharging. In the meantime, when the signal $V_{IN2}$ is changed from "0" to "1", some of electrical charge charged in the wiring capacitors of the wirings L10, L12 and L13 are stored in the wiring capacitor of the wiring L11 through the switches 62, 64 and 65, the electrical charge recycling circuit 32a and the switch 54.

At this time, the signal $V_{OUT2}$ goes down to the voltage $V_{INT\_LOW}$ and then, the remaining electrical charge are charged in the wiring capacitor of the wiring L11 and thus, the voltage goes up to the power supply voltage $V_{DD}$. When a plurality of reserved wirings are used for storing electrical charge of a single wiring, the wiring capacitor for storing electrical charge becomes larger compared to a case where a single reserved wiring is used. That is, when a plurality of reserved wirings are used, the capacitor values CR of Equation 3 and Equation 4 described above become larger compared to a case where a single reserved wiring is used. For example, when it is assumed that CR=∞ by taking into account a case where the ratio of the reserved wirings to the wirings in which signal is propagated, the voltage $V_{INT\_LOW}$ and the voltage $V_{INT\_HIGH}$ may be represented by the following Equation 10 and Equation 11 from Equation 3 and Equation 4.

[Equation 10]

$$V_{INT\_LOW} = \lim_{C_R \to \infty} \frac{C_R}{C_L + 2C_R} V_{DD} = \frac{1}{2} V_{DD} \qquad (10)$$

[Equation 11]

$$V_{INT\_HIGH} = \lim_{C_R \to \infty} \frac{C_L + C_R}{C_L + 2C_R} V_{DD} = \frac{1}{2} V_{DD} \qquad (11)$$

That is, we may know that each of the voltage $V_{INT\_LOW}$ and the voltage $V_{INT\_HIGH}$ approaches to $V_{DD}/2$ as the wiring capacitor of the reserved wiring portion becomes larger. As in Equation 8 and Equation 9 described above, the voltage $V_{INT\_LOW}$ and the voltage $V_{INT\_HIGH}$ for a case where a single reserved wiring is used for storing electrical charge of a single wiring are $V_{DD}/3$ and $2V_{DD}/3$, respectively. Therefore, when a plurality of reserved wirings are used, the voltage $V_{INT\_LOW}$ becomes larger but the voltage $V_{INT\_HIGH}$ becomes smaller, compared to a case where a single reserved wiring is used.

When the voltage $V_{INT\_HIGH}$ becomes smaller, an amount of the voltage drop by discharging may be small. Therefore, when a plurality of reserved wirings is used, the power consumption may be further reduced compared to a case where a single reserved wiring is used.

Further, when the voltage $V_{INT\_HIGH}$ becomes larger, an amount of the voltage rise caused by charging may be small. Therefore, when a plurality of reserved wirings is used, the power consumption may be further reduced compared to a case where a single reserved wiring is used.

When CR=∞, consumption energy may be represented by Equation 6 and Equation 7 and thus, the consumption energy becomes $C_L V_{DD}^2/8$ even when the signal $V_{IN1}$ is changed from "1" to "0" as well as when the signal VIN1 is changed from "0" to "1. The consumption energy becomes $C_L V_{DD}^2/2$ at the time when the charge recycling is not used (the voltage is changed from 0 V to the power supply voltage $V_{DD}$ at the time of charging or discharging) and thus, power reduction efficiency is about ¼ (75%).

Further, in FIG. 14 to FIG. 16, the charge recycling is performed using the wiring capacitors of a single or a plurality of reserved wirings and thus, the power consumption may be suppressed due to the small area. Further, the selection units 35-1 and 35-2 illustrated in FIG. 14 to FIG. 16 are provided such that for example, the power consumption becomes large with respect to the wiring in which the signal having a high operation rate is propagated and thus, the charge recycling is allowed to be enabled to reduce the power consumption. Further, it becomes possible to perform a selection, such as disabling of the charge recycling with respect to the wiring in which the signal, that does not satisfy the timing constraints when the delay becomes large, is propagated.

Next, a method for designing the semiconductor integrated circuit 10 which performs the charge recycling described above will be described.

(Method for Designing the Semiconductor Integrated Circuit 10)

Figure 17:
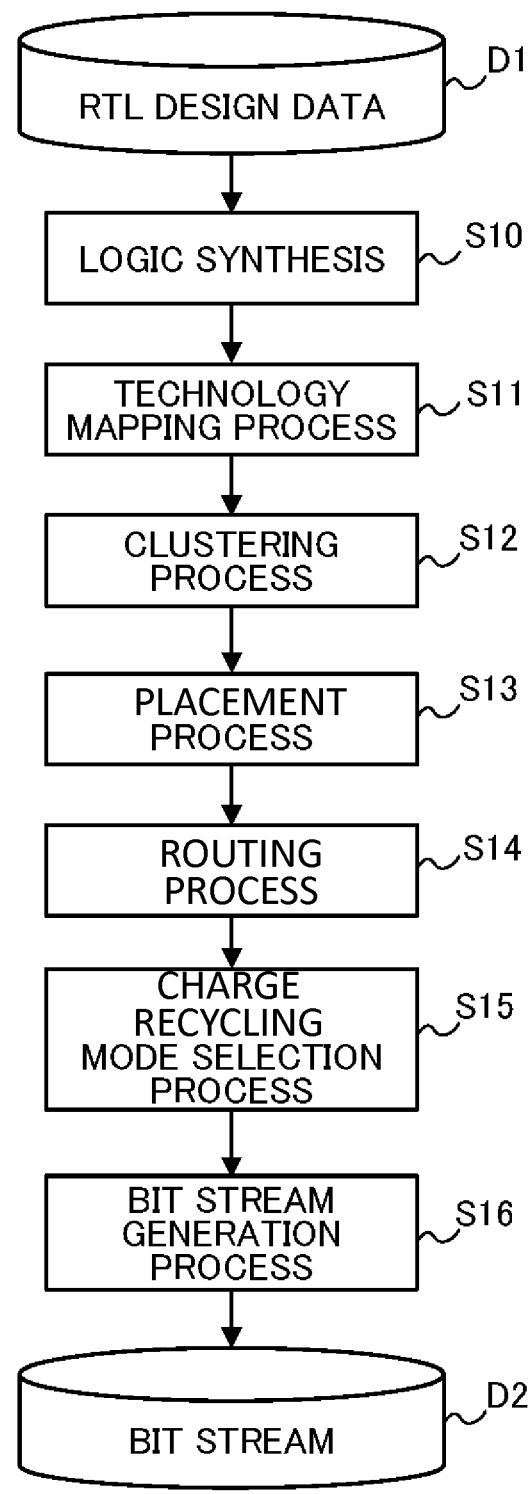
FIG. 17 is a flowchart illustrating a flow of an example of the method for designing the semiconductor integrated circuit.

FIG. 17 is a flowchart illustrating a flow of an example of a method for designing the semiconductor integrated circuit.

First of all, RTL (Register Transfer Level) design data D1 is converted into a netlist by logic synthesis (step S10). RTL design data D1 is described in a hardware description language such as Verilog-HDL (Hardware Description Language) or VHDL (Very high-speed integrated circuit HDL). Further, in the processing of step S10, SystemC, C or C++ description may be synthesized in a high order.

Next, a technology mapping process and a clustering process are performed (step S11 and step S12). In the technology mapping process, a combination circuit portion is mapped to the LUT within the basic logic element (see, for example, FIG. 8) and registers are mapped to the flip-flops. In the clustering process, a plurality of basic logic elements is collectively mapped to the CLB (see, for example, FIG. 7).

Thereafter, a placement process is performed (step S13). In the placement process, a location of the CLB on the FPGA is determined. When the placement process is ended, a routing process is performed for which the charge recycling is taken into account and an electrical charge recycling mode selection process that determines whether the charge recycling is enabled with respect to a certain wiring by taking into account the timing constraints (step S14 and step S15). When the charge recycling is enabled, a delay occurs longer than a case where the charge recycling is disabled and thus the charge recycling may be selected in such a manner that the charge recycling is enabled using wirings as much as possible to further decrease the power consumption in a range that satisfies the timing constraints.

Thereafter, the bitstream generation process is performed (step S16). In the bitstream generation process, the bitstream (binary data) D2 for a FPGA configuration is generated from the confirmed disposition information.

The designing method described above is performed by, for example, a designing device to be described below.

(Example of a Designing Device)

Figure 18:
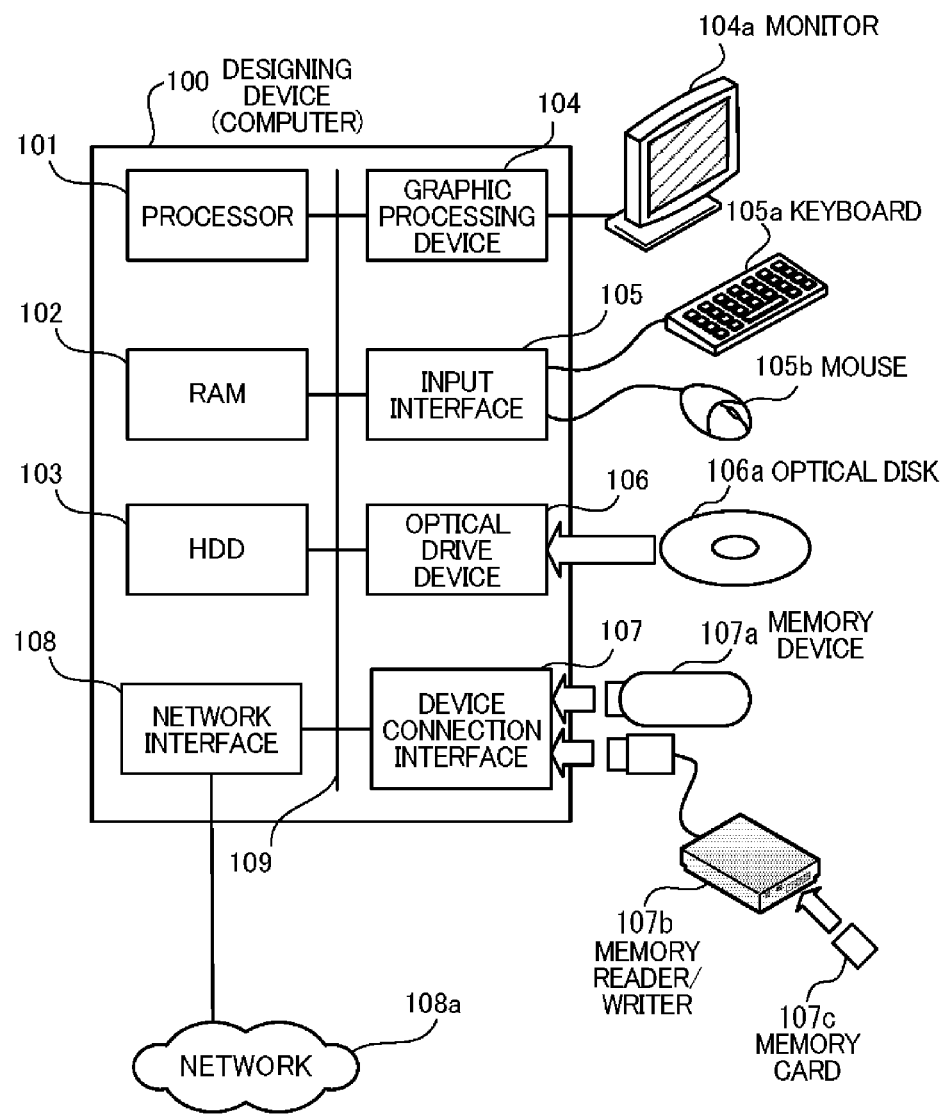
FIG. 18 is a view illustrating an example of hardware of a designing device.

FIG. 18 is a view illustrating an example of hardware of a designing device.

The designing device 100 may be a computer as illustrated in FIG. 18 and the entirety of the designing device 100 may be controlled by a processor 101. A RAM (Random Access Memory) 102 and a plurality of peripheral devices are connected to the processor 101 through the bus 109. The processor 101 may be a multiprocessor. The processor 101 is, for example a CPU (Central Processing Unit), MPU (Micro Processing Unit), DSP (Digital Signal Processor), ASIC or PLD (Programmable Logic Device). Further, the processor 101 may be a combination of two or more components of the CPU, MPU, DSP, ASIC and PLD.

The RAM 102 is used as a main storage device of the designing device 100. At least a portion of an OS (Operating System) program that causes the processor 101 to execute a predetermined process or an application program is temporarily stored in the RAM 102. Further, various data needed for processing by the processor 101 are stored in the RAM 102.

The A HDD (Hard Disk Drive) 103, a graphic processing device 104, an input interface 105, an optical drive device 106, the device connection interface 107 and network interface 108 that correspond to peripheral devices are connected to the bus 109.

The HDD 103 magnetically writes and reads data into and from an internal disk. The HDD 103 is used as an auxiliary storage device of the designing device 100. The OS program, the application program and various data are stored in the HDD 103. Further, a semiconductor storage device such as a flash memory may be used as the auxiliary storage device.

The monitor 104a is connected to the graphic processing device 104. The graphic processing device 104 displays images on a screen of the monitor 104a according to an instruction from the processor 101. The monitor 104a may be a display device using a CRT (Cathode Ray Tube) or a liquid crystal display device.

The keyboard 105a and the mouse 105b are connected to the input interface 105. The input interface 105 transmits signal sent from the keyboard 105a or the mouse 105b to the processor 101. Further, the mouse 105b is an example of a pointing device and other pointing devices may be used as the mouse. Other pointing devices may include, for example, a touch panel, tablet, touch pad and track ball.

The optical drive device 106 reads data recorded in the optical disk 106a using, for example, laser light. The optical disk 106a is a portable recording medium in which data are recorded to be readable by reflection of light. The optical disk 106a is, for example, a DVD (Digital Versatile Disc), DVD-RAM, CD-ROM (Compact Disc Read Only Memory) and CD-R (Recordable)/RW (ReWritable).

The device connection interface 107 is a communication interface for connecting the peripheral device to the designing device 100. For example, a memory device 107a or a memory reader/writer 107b may be connected to the device connection interface 107. The memory device 107a is a recording medium in which the functionality for communicating with the device connection interface 107 is equipped. The memory reader/writer 107b is a device which writes data into the memory card 107c or reads data from the memory card 107c. The memory card 107c is a card type recording medium.

The network interface 108 is connected to the network 108a. The network interface 108 transmits and receives data to and from other computer or a communication device through the network 108a.

The designing method as illustrated in FIG. 17 is implemented by the hardware configuration described above. Further, the designing device 100 executes a program recorded in, for example, the computer readable recording medium to implement the designing method. The program in which the processing contents to be executed by the designing device 100 is described may be recorded in various recording medium. For example, the program to be executed by the designing device 100 may be stored in the HDD 103. The processor 101 loads at least a portion of the program stored in the HDD 103 into the RAM 102 and executes the program. Further, the program to be executed by the designing device 100 may be recorded in, for example, the optical disk 106a, the memory device 107a and the memory card 107c. The program stored in the portable recording medium may be executed, for example, after the program is installed in the HDD 103 by the control of the processor 101. Further, the processor 101 may read the program directly from the portable recording medium to be executed.

Hereinbelow, an example of the routing processing of step S14 illustrated in FIG. 17 will be described.

(Example of Routing Process)

Figure 19:
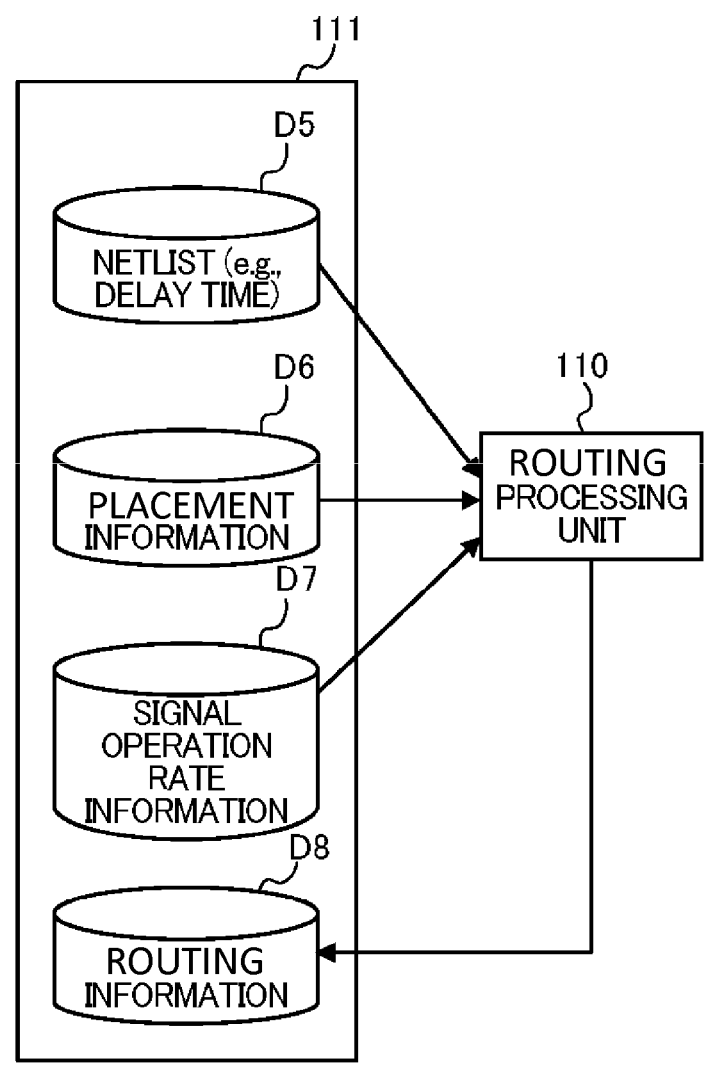
FIG. 19 is a view illustrating an example of functional blocks performing a routing process.

FIG. 19 is a view illustrating an example of functional blocks performing a routing process.

A routing processing unit 110 that performs the routing process and a storage unit 111 are illustrated in FIG. 19. The routing processing unit 110 obtains a slack ratio (to be described below) based on the netlist (D5) (including, for example, the wiring delay) the placement information D6 and the signal operation rate information D7 stored in the storage unit 111 to perform the routing process, and generates and stores the routing information D8 in the storage unit 111.

Further, the routing processing unit 110 and the storage unit 111 are implemented by, for example, the processor, RAM 102, HDD 103 of the designing device 100 illustrated in FIG. 18. During the routing process, the routing processing unit 110 represents an internal wiring structure of the FPGA by a directed graph.

Figure 20:
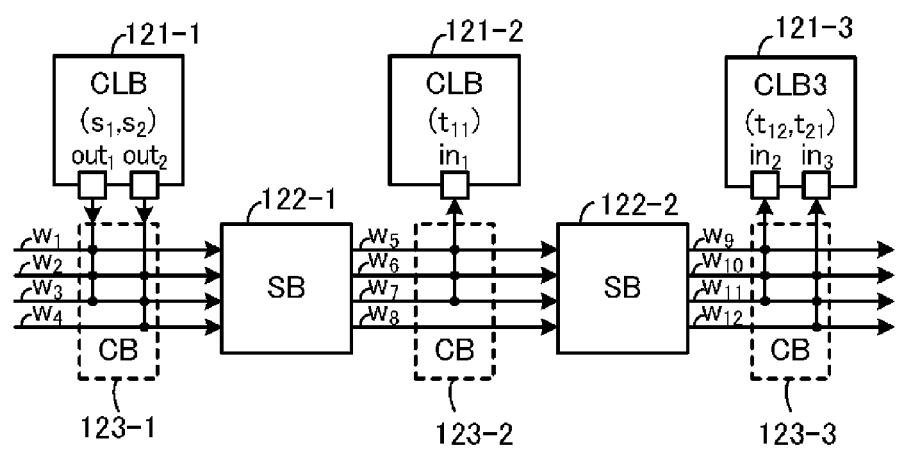
FIG. 20 is a view illustrating an example of a portion of a wiring structure of FPGA.
Figure 21:
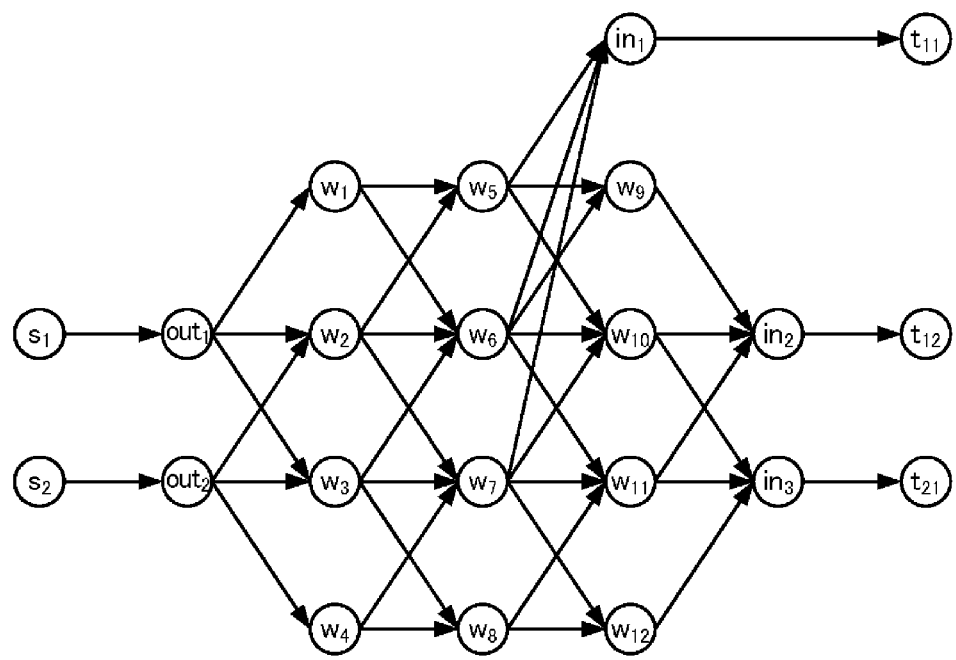
FIG. 21 is a view illustrating an example of a directed graph corresponding to the wiring structure of FIG. 20.

FIG. 20 is a view illustrating an example of a portion of the wiring structure of FPGA. Further, FIG. 21 is a view illustrating an example of a directed graph corresponding to the wiring structure of FIG. 20. In the wiring structure of FIG. 20, an output terminal out1 of a CLB 121-1 is connected to the wirings $w_1$, $w_2$ and $w_3$ by a CB 123-1. An output terminal out2 of the CLB 121-1 is connected to wirings w2, w3 and $w_4$ by the CB 123-1. An input terminal in1 of a CLB 121-2 is connected to wirings $w_5$, $w_6$ and $w_7$ by a CB 123-2. Further, an input terminal in2 of a CLB 121-3 is connected to wirings $w_9$, $w_{10}$ and $w_{11}$ by a CB 123-3 and an input terminal in3 is connected to wirings $w_{10}$, $w_{11}$ and $w_{12}$ by the CB 123-3. A SB 122-1 performs a switching connection between the wiring $w_1$ to $w_4$ and the wirings $w_5$ to $w_8$. A SB 122-2 performs a switching connection between the wiring w5 to w8 and the wirings $w_9$ to $w_{12}$.

Further, $s_1$ and $s_2$ indicate start points of the signal, and $t_{11}$, $t_{12}$ and $t_21$ indicate end points of the signal in FIG. 20. In the directed graph illustrated in FIG. 21, the paths from the start points ($s_1$, $s_2$) of the signal to the end points ($t_{11}$, $t_{12}$, $t_{21}$) of the signal are represented by defining the output terminals $out_1$ and $out_2$, the input terminals $in_1$ to $in_3$ and the wirings $w_1$ to $w_{12}$ as vertices.

The delay of the wirings $w_1$ to $w_{12}$ is represented by weights of a sequence of edges which connect a sequence of vertices in the directed graph. An optimum allocation of the signal for the routing may be determined in such a manner that the path spanning from the start point to the end point for which the cost obtained using a cost function to be described below becomes the minimum is obtained.

Figure 22:
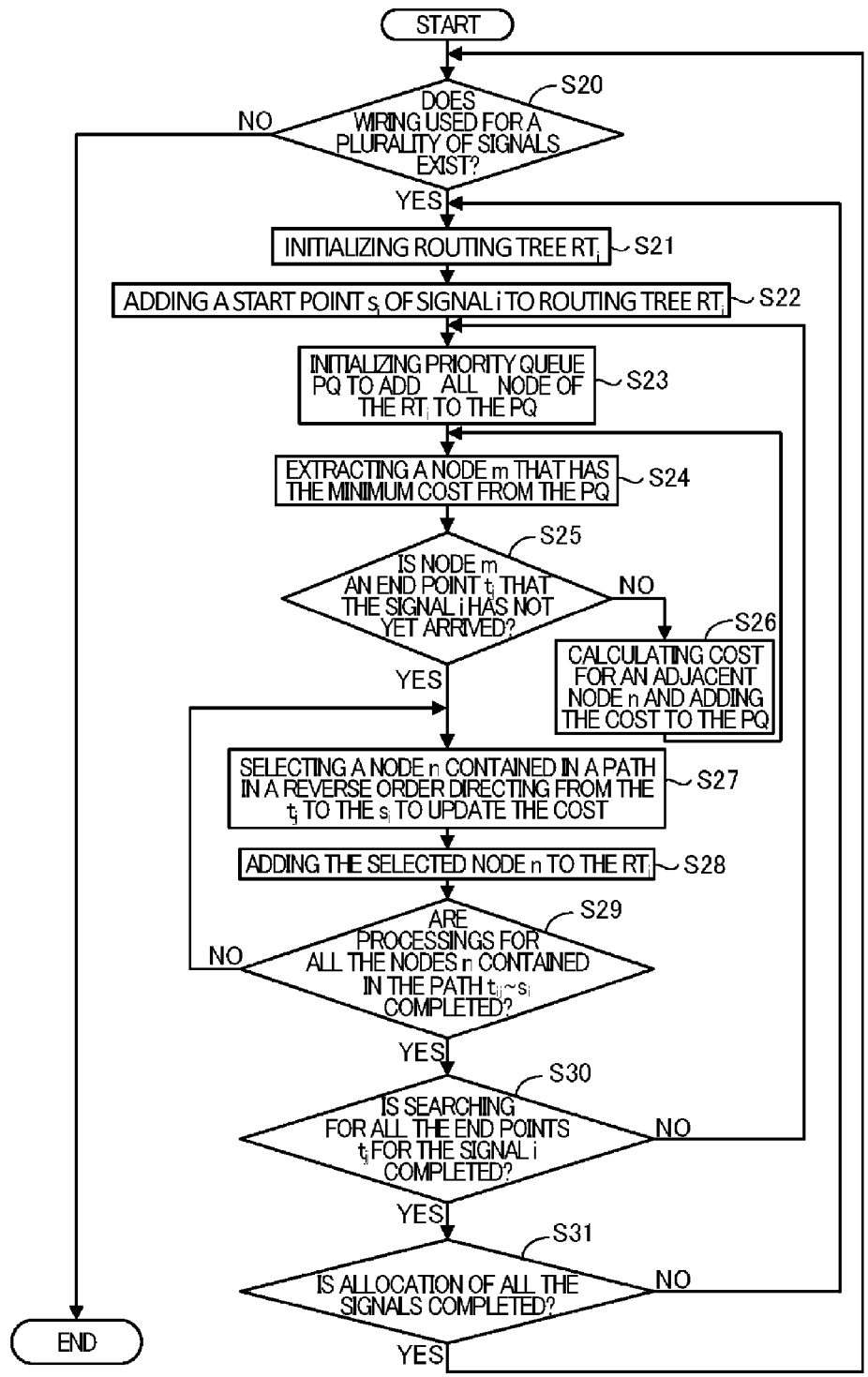
FIG. 22 is a flowchart illustrating a flow of an example of the routing process.

FIG. 22 is a flowchart illustrating a flow of an example of the routing process. Before processing the flowchart, the routing processing unit 110 performs a routing process that allows allocation of a plurality of signals for a single wiring and makes the delay to be the minimum. For example, a shortest-path algorithm is used in this first iteration.

First of all, the routing processing unit 110 determines whether the wiring used for a plurality of signals exists (step S20). When it is determined that the wiring used for a plurality of signals exists, the routing processing unit 110 performs a process starting from step S21 and otherwise, when it is determined that the wiring used for a plurality of signals does not exist, the routing processing unit 110 ends the routing process.

In the processing of step S21, the routing processing unit 110 initializes a routing tree $RT_i$ that maintains a path over which the signal is transmitted. After initialization of the routing tree $RT_i$, the routing processing unit 110 adds a start point $s_i$ of the path over which the signal i is transmitted in the routing tree $RT_i$ (step S22).

Thereafter, the routing processing unit 110 searches for the end point by a breadth-first search strategy in the following searching order. The routing processing unit 110 initializes the priority queue PQ and sets the cost of all node of the routing tree $RT_i$ as 0 (zero) to add the cost to the priority queue PQ (step S23). Next, the routing processing unit 110 extracts a node m that has the minimum cost from the priority queue PQ (step S24) and determines whether the node m is an end point $t_{ij}$ that the signal i has not yet arrived (step S25).

When it is determined that the node m is not an end point $t_{ij}$ that the signal i has not yet arrived, the routing processing unit 110 performs a cost calculation for a node n adjacent to the node m and an addition of the cost to the priority queue PQ (step S26). An example of the processing of step S26 will be described below. After the processing of step S26, the process starting from step S24 is repeated.

In the meantime, when it is determined that the node m is an end point $t_{ij}$ that the signal i has not yet arrived, the routing processing unit 110 selects a node n within the path in a reverse order directing from the end point $t_{ij}$ to the start point $s_i$ to update the cost (step S27), and adds the selected node n to the routing tree $RT_i$ (step S28).

Also, the routing processing unit 110 determines whether the processings for all the nodes n within the path spanning from the end point $t_{ij}$ to the start point $s_i$ are completed (step S29). When it is determined that the processings are not completed, the routing processing unit 110 repeats the process starting from step S27.

When the routing processing unit 110 determines that all the nodes n within the path spanning from the end point $t_{ij}$ to the start point $s_i$ are completed, it is regarded that the path spanning from a certain start point $s_i$ to a certain end point $t_{ij}$ is obtained. Accordingly, the routing processing unit 110 determines whether searching for all the end points $t_{ij}$ for the signal i is completed (step S30). When a plurality of the end points $t_{ij}$ exist and an end point $t_{ij}$ that is not yet searched exists, the routing processing unit 110 repeats the process starting from the step S23.

When it is determined that searching for all the end points $t_{ij}$ is completed, the routing processing unit 110 determines whether allocation of all the signals for the wiring is completed (step S31). Since the routing tree $RT_i$ serves to temporarily store the path of the signal i, the routing tree $RT_i$ is initialized each time when allocation of a single for the wiring is completed. Therefore, when it is determined that allocation of all the signals for the wiring is not completed, the routing processing unit 110 repeats the process starting from step S21.

When allocation of all the singles for the wirings is completed, the routing processing unit 110 performs the determination of step S20 again. Here, when the wiring used for a plurality of signals exists, the routing processing unit 110 performs the routing process for all the signals again. Since the coefficient of a cost function varies according to a result of a previous routing process, the signal passes through a path different from the path at the previous routing process, at the next routing process. Therefore, allocation of all the signals for the wiring is repeated and the wiring used for a plurality of signals becomes non-existent finally. By doing this, the routing process is ended.

Next, an example of the processing of step S26 will be described by exemplifying a case where the wiring for storing electrical charge is fixed (see, for example, FIG. 9) and a case where the wiring for storing electrical charge may be arbitrarily changed (see, for example, FIG. 14).

(Case where the Wiring for Storing Electrical Charge is Fixed)

Figure 23:
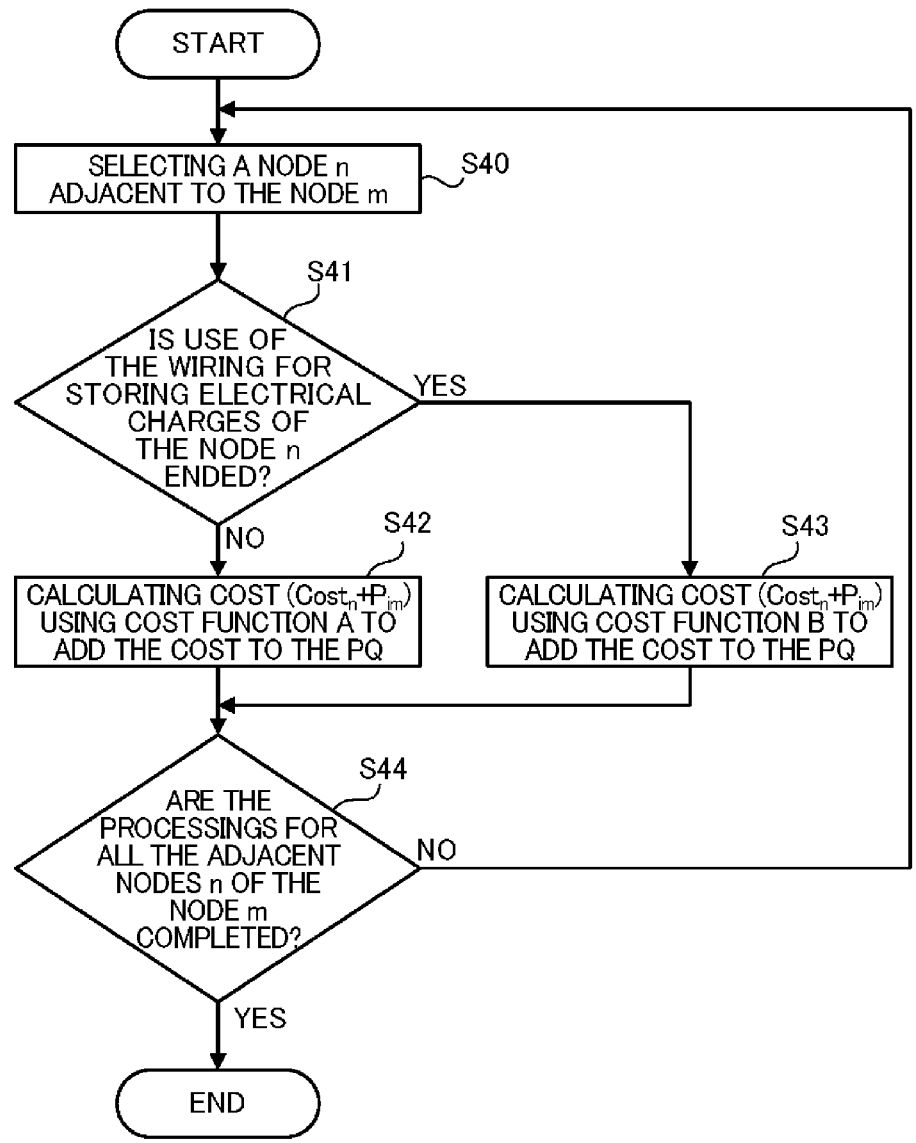
FIG. 23 is a flowchart illustrating an example of a process of performing a cost calculation regarding a node (n) adjacent to a node (m) and an addition of the cost to a priority queue PQ when the wiring used for storing electrical charge is fixed.

FIG. 23 is a flowchart illustrating an example of a process of performing a cost calculation and an addition of a cost to the priority queue PQ regarding a node n adjacent to a node m when the wiring for storing electrical charge is fixed.

The routing processing unit 110 selects a node n adjacent to the node m that is a candidate for allocating the signal i (step S40) and determines whether use of the wiring for storing electrical charge of the node n is ended as a candidate for allocating another signal j (step S41).

When use of the wiring for storing electrical charge of the node n is not ended, the routing processing unit 110 calculates the cost (Costn+Pim) using the cost function A and adds the cost (Costn+Pim) to the priority queue PQ (step S42). The Costn is a cost at the node n and the Pim is a cost of a path from the start point $s_i$ to the node m.

In the processing of step S42, the routing processing unit 110 obtains the $Cost_n$ by Equation 12 as the cost function A using "Pathfinder method" (see non-patent literature 2).

[Equation 12]

$$Cost(n)=(1-Crit(i))\cdot cong\_cost(n)+Crit(i)\cdot delay\_cost(n) \quad (12)$$

In Equation 12, the Crit(i) is represented by the following Equation 13 and indicates a slack ratio of the signal i.

[Equation 13]

$$Crit(i) = \frac{delay_i}{delay_{max}} \quad (13)$$

In Equation 13, $delay_i$ is the delay of the signal i and $delay_{max}$ is the maximum delay of all the signals. Therefore, it becomes 0<Crit(i)≤1. The Crit(i) becomes closer to 1 (one) as the delay of the signal i becomes closer to the maximum delay (a margin of the timing becomes smaller), and becomes closer to a value of 0 (zero) as the delay of the signal i becomes smaller than the maximum delay (a margin of the timing becomes larger).

The cong_cost(n) of Equation 12 indicates a congestion degree of the node n and becomes larger value as the node n becomes candidates for allocation of more signals. Further, delay_cost(n) indicates the delay of the wiring n.

As described above, the node m having the minimum cost is extracted in the processing of step S24 of FIG. 22. As in Equation 12, when the timing of the signal i is critical (factor) (when Crit(i) is closer to 1 (one)), the delay_cost(n) becomes dominant in the cost and the cost becomes smaller as the delay of the node n becomes smaller. Therefore, the node n becomes easy to be selected in the processing of step S24.

Further, the cong_cost(n) becomes further dominant in the cost as the margin of the timing becomes larger (when Crit(i) is closer to 0 (zero)) and the cost becomes smaller as the congestion degree of the node n becomes smaller. That is, the node n becomes easy to be selected in the processing of step S24 as the congestion degree of the node n becomes smaller.

In the meantime, when use of the wiring for storing electrical charge of the node n is ended, the routing processing unit 110 calculates the cost ($Cost_n+P_{im}$) using the cost function B and adds the cost ($Cost_n+P_{im}$) to the priority queue PQ (step S43).

In the processing of step S43, the routing processing unit 110 obtains the $Cost_n$ by Equation 14 as the cost function B.

[Equation 14]

$$Cost(n)=(1-Crit)\cdot[cong\_cost(n)+(1-\alpha_i)\cdot res\_cost(n)+\alpha_i PF]+Crit(i)\cdot delay\_cost(n) \quad (14)$$

In Equation 14, αi is an operation rate of the signal i, PF is an integer number for adjustment and res_cost(n) is represented by the following Equation 15.

[Equation 15]

$$res\_cost(n)=(1-Crit(j))\cdot\alpha_j \quad (15)$$

In Equation 15, j indicates an index of the signal allocated to the wiring for storing electrical charge of the node n that is a candidate for an allocation of the signal i. As in Equation 14, when the timing of the signal i is critical factor (when Crit(i) is closer to 1 (one)), the delay_cost(n) becomes dominant in the cost. Therefore, the cost becomes larger as the delay of the node n becomes larger and thus, the node n becomes difficult to be selected as a candidate for the path of the signal i in the processing of step S24. The delay of the wiring for which the charge recycling is performed becomes larger and thus, when an inherent delay (the wiring delay) of the node n is large, the node n becomes difficult to be selected as a candidate for the path of the signal i by this processing. Accordingly, performance of the charge recycling for (with respect to) the node n that has a large delay is suppressed and it is possible to suppress the margin of the timing from being smaller.

In contrast, when the delay of the node n is small, the node n becomes easy to be selected as the candidate for the path of the signal i in the processing of step S24. Therefore, the charge recycling for the node n may be performed so as to reduce the power consumption.

When there is a margin in the timing of the signal i (when Crit(i) is closer to 0 (zero)), the values of the cong_cost(n) and αi·PF become dominant as the operation rate αi of the signal i becomes larger. When the value of the cong_cost(n) is constant, the PF is appropriately adjusted such that the cost becomes smaller when the value of αi·PF is dominant. Therefore, the node n becomes easy to be selected as the candidate for the path of the signal i in the processing of step S24. That is, the node n becomes easy to be selected as the candidate for the path of the signal i and the charge recycling for the node n may be performed so as to reduce the power consumption.

When there is a margin in the timing of the signal i and the operation rate αi of the signal i is small, the values of the cong_cost(n) and res_cost(n) become dominant. When the value of the cong_cost(n) is constant and there is a margin in the timing of the signal j (when the Crit(j) is closer to 0 (zero)), the cost becomes larger when the operation rate of the signal j that is already allocated for use of the wiring for storing electrical charge is high.

Therefore, the node n becomes difficult to be selected as the candidate for the path of the signal i in the processing of step S24. Accordingly, the wiring for storing electrical charge of the node n becomes easy to be selected as a portion of the path that propagates the signal j and the charge recycling becomes easy to be performed in the wiring over which the signal j is transmitted. As described above, the charge recycling is performed for the wiring over which the signal j having the high operation rate is propagated and thus, an effect of the reduction of power consumption increases.

After processings of step S42 and step S43, the routing processing unit 110 determines whether the processings for all the adjacent nodes n of the node m are completed (step S44). When it is determined that the processings for all the adjacent nodes n of the node m are not completed, the routing processing unit 110 repeats the process starting from step S40. When it is determined that the processings for all the adjacent nodes n of the node m are completed, the routing processing unit 110 ends a process of performing a cost calculation for the node n adjacent to the node m and an addition of the cost to the priority queue PQ.

(A Case where the Wiring for Storing Electrical Charge May be Arbitrarily Changed)

Figure 24:
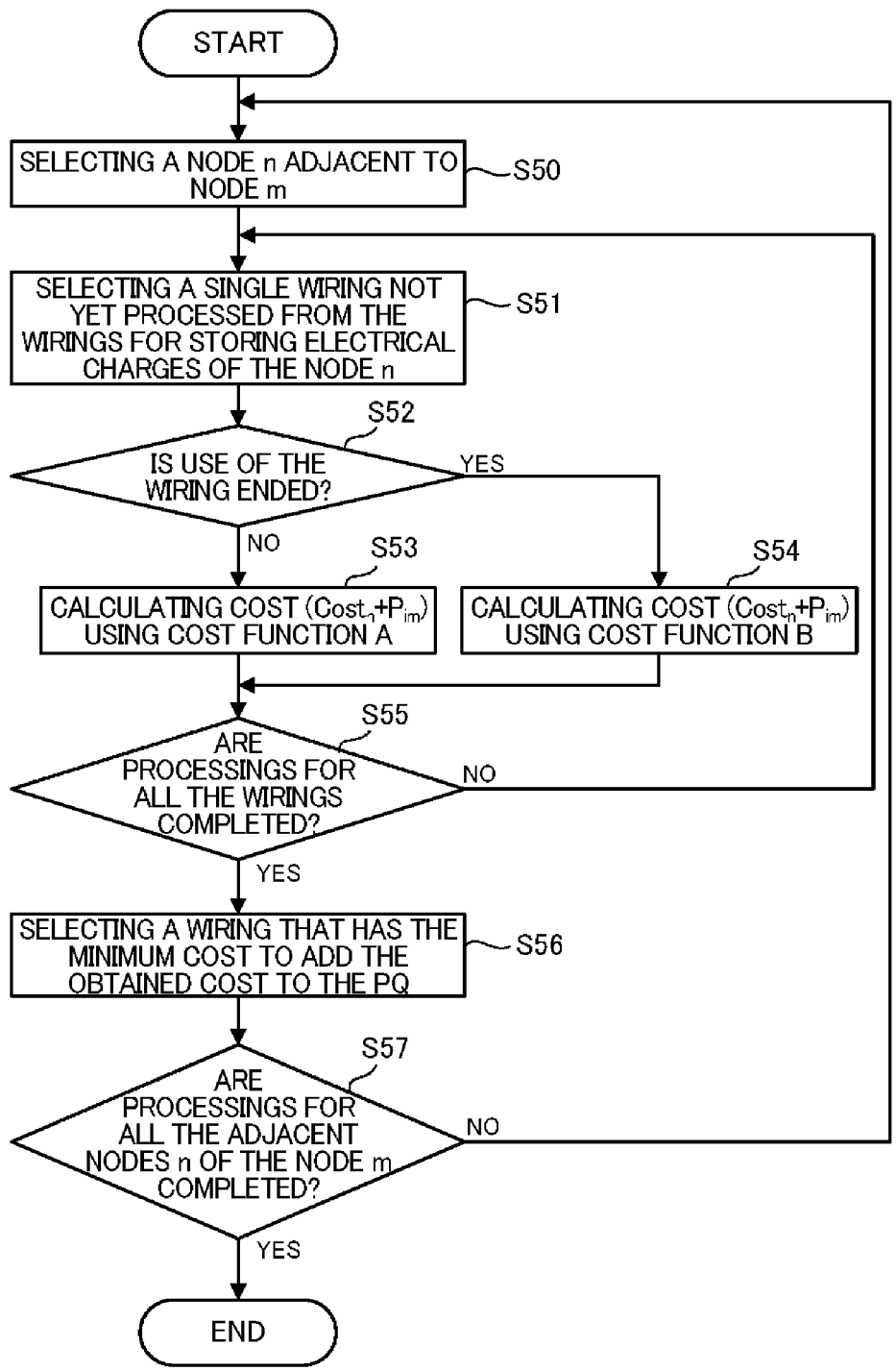
FIG. 24 is a flowchart illustrating an example of a process of performing a cost calculation regarding the node (n) adjacent to the node (m) and an addition of the cost to the priority queue PQ when the wiring used for storing electrical charge is arbitrarily changed.

FIG. 24 is a flowchart illustrating an example of a process of performing a cost calculation regarding the node n adjacent to the node m and an addition of the cost into a priority queue PQ when the wiring for storing electrical charge may be arbitrarily changed.

The routing processing unit 110 selects a single node n adjacent to the node m of a candidate for allocating the signal i (step S50) and selects a single wiring, that is not yet processed, from the wirings for storing electrical charge of the node n (step S51).

Also, the routing processing unit 110 determines whether use of the wiring for storing electrical charge of the node n is ended as a candidate for allocating of other signal j or a candidate of the wiring for storing electrical charge used by other wiring over which other signal j is propagated (step S52).

When use of the wiring for storing electrical charge of the node n is not ended, the routing processing unit 110 calculates the cost ($Cost_n + P_{im}$) using the cost function A represented by Equation 12 and Equation described above (step S53).

When use of the wiring for storing electrical charge of the node n is ended, the routing processing unit 110 calculates the cost ($Cost_n + P_{im}$) using the cost function B represented by Equation 14 and Equation 15 described above (step S54).

However, in the processing of FIG. 24, j of Equation 15 indicates an index of the signal allocated to the wiring for storing electrical charge selected in the processing of step S51 or a signal that propagates in other wiring which uses the wiring for storing electrical charge.

When the timing of the signal i is a critical factor, or when there is a margin in the timing of the signal i and the operation rate αi of the timing is large, the same effect as the case where the wiring for storing electrical charge is fixed may be obtained.

When there is a margin of the timing of the signal i and the operation rate αi of the timing is small, the values of the cong_cost(n) and res_cost(n) become dominant. In this case, the cost increases when the operation rate αi of the signal j is large. Therefore, the node n becomes difficult to be selected as a candidate for the path of the signal i in the processing of step S24. Accordingly, the wiring for storing electrical charge of the node n becomes easy to be selected as a portion of the path that propagates the signal j or as a wiring for storing electrical charge of the wiring over which the signal j is propagated. As described above, the charge recycling is allowed to be easily applied to the wiring over which the signal j having the high operation rate is propagated and thus, an effect of reduction of the power consumption increases.

After processings of step S53 and step S54, the routing processing unit 110 determines whether the processings of step S51 to step S54 for all the wirings for storing electrical charge are completed (step S55). When it is determined that the processings of step S51 to step S54 for all the wirings for storing electrical charge of the node n are not completed, the routing processing unit 110 repeats the process starting from step S51.

When it is determined that the processings of step S51 to step S54 for all the wirings for storing electrical charge of the node n are completed, the routing processing unit 110 selects the wiring that has the minimum cost among all the wirings to add the obtained cost to the priority queue PQ (step S56).

Thereafter, the routing processing unit 110 determines whether the processings of step S50 to step S56 are completed for all the adjacent nodes n of the node m (step S57). When it is determined that the processings of step S50 to step S56 for all the adjacent nodes n of the node m are not completed, the routing processing unit 110 repeats the process starting from step S50.

When it is determined that the processings of step S50 to step S56 for all the adjacent node of the node m are completed, the routing processing unit 110 ends the process of performing a cost calculation for the node n adjacent to the node m and an addition of the cost to the priority queue PQ Hereinbelow, an example of the electrical charge recycling mode selection processing of step S15 illustrated in FIG. 17 will be described.

(Example of Electrical Charge Recycling Mode Selection Process)

Figure 25:
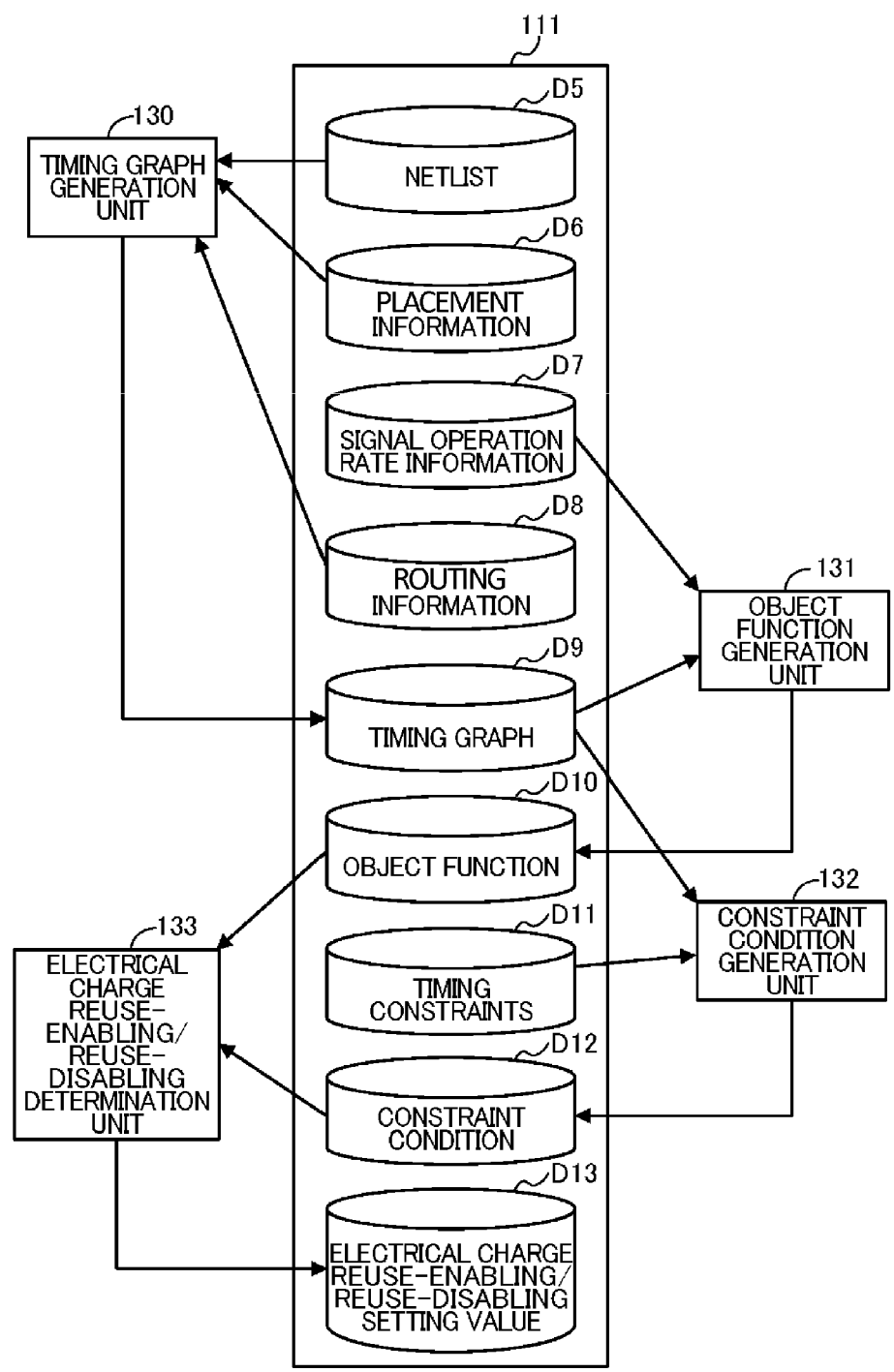
FIG. 25 is a view illustrating an example of functional blocks performing a selection process of an electrical charge recycling mode.

FIG. 25 is a view illustrating an example of functional blocks performing an electrical charge recycling mode selection process.

In FIG. 25, a timing graph generation unit 130, an object function generation unit 131, a constraint condition generation unit 132 and an electrical charge recycling-enabling/-disabling determination unit 133 are illustrated in addition to the storage unit 111 illustrated in FIG. 19.

The timing graph generation unit 130 generates a timing graph D based on the netlist D5, the placement information D6, the routing information D8 that are stored in the storage unit 111 to store the timing graph D in the storage unit 111.

The object function generation unit 131 generates an object function D10 based on the signal operation rate information D7 and the timing graph D9 that are stored in the storage unit 111. The constraint condition generation unit 132 generates a constraint condition D12 for each node based on the timing graph D9 and the timing constraints D11 that are stored in the storage unit 111 to store the constraint condition in the storage unit 111.

The electrical charge recycling-enabling/-disabling determination unit 133 generates an electrical charge recycling-enabling/-disabling setting value D13 based on the object function D10 and the constraint condition D12 that are stored in the storage unit 111 to store the electrical charge recycling-enabling/-disabling setting value D13 in the storage unit 111. In the present embodiment, the electrical charge recycling-enabling/-disabling determination unit 133 is assumed as a Mixed Integer Linear Programming (MILP) solver that determines whether the electrical charge recycling of a certain wiring is to be enabled The timing graph generation unit 130, the object function generation unit 131, the constraint condition generation unit 132, the electrical charge recycling-enabling/-disabling determination unit 133 and the storage unit 111 are implemented by, for example, the processor 101, RAM 102 and HDD 103 of the designing device 100 illustrated in FIG. 18.

Figure 26:
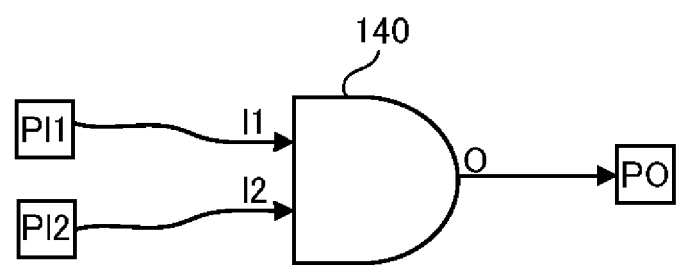
FIG. 26 is a view illustrating an example of a logical circuit represented by a timing graph.

Hereinbelow, an example of obtaining a wiring for which the charge recycling is enabled will be described. FIG. 26 is a view illustrating an example of a logical circuit represented by a timing graph. An AND circuit 140 which performs a logical AND operation between signals 11 and 12 inputted from terminals PI1 and PI2 and outputs the result of the logical AND operation to the terminal PO as a signal O is illustrated in FIG. 26.

Figure 27:
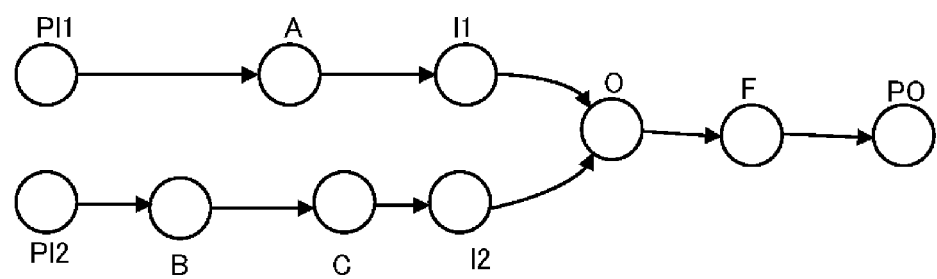
FIG. 27 is a view illustrating an example of a generated timing graph.

The timing graph generation unit 130 generates the following timing graph from a logical circuit as illustrated in FIG. 26 based on the netlist D5, the disposition information D6 and the wiring information D8. FIG. 27 is a view illustrating an example of a created timing graph.

The timing graph G(V, E) indicates a combination circuit in which vertices of a graph are represented by the wiring and the terminal of the logical circuit and edges of the graph are represented by the programmable switch and LUT of the wiring.

At this time, a delay $D_v$ of a certain wiring (vertex) v in a set of vertices V is represented by the following Equation 16.

[Equation 16]

$$D_v = DIntrinsic_v + \gamma_v \cdot \delta_v \quad (16)$$

In Equation 16, $DIntrinsic_v$ indicates a delay when the charge recycling is not performed and $\gamma_v$ indicates a variable having a binary value (0/1) that indicates whether the wiring v uses the charge recycling mode (whether the charge recycling is enabled or disabled). Further, $\delta_v$ indicates a delay to be added when the charge recycling is enabled.

The delay from an input to a certain vertex v in a worst case is represented by the following Equation 17.

[Equation 17]

$$Arr_v \geq \forall_{(u,v) \in E} Arr_u + D_v \quad (17)$$

In the worst case delay, delays of all the inputs to the vertex v may be obtained using Max function, but the Mixed Integer Linear Programming is used in the present embodiment and thus, the delay may be represented by the Equation 17 described above. Further, when the number of inputs is one, the form of Equation 17 becomes a form without the sign of inequality.

When it is assumed that CO is a subset of a set V comprised of terminal ends of the combination circuit (e.g., all the output terminals and the input terminal of the flip-flop) and a user defined timing constraints is T, the constraint condition generation unit 132 generates the constraint condition represented by the following Equation 18.

[Equation 18]

$$\forall_{v \in CO} Arr_v \leq T \quad (18)$$

Further, when it is assumed that CR is the wirings (having reserved wirings) which are the subset of the set V and for which the charge recycling may be applied, the object function generation unit 131 generates an object function represented by the following Equation 19.

[Equation 19]

$$\phi = \sum_{i \in CR} \alpha_i \cdot \gamma_i - \sum_{j \in V} Arr_j \quad (19)$$

In Equation 19, $\alpha i$ is an operation rate of a vertex i and a first term indicates the sum of the wirings for which the charge recycling may be enabled and to which a weighting factor is given by the operation rate, and the next term becomes the sum of the delays. The electrical charge recycling-enabling/-disabling determination unit 133 may obtain the γ that makes the Φ maximum by the Mixed Integer Linear Programming using the conditions of Equation 16 to Equation 18 and Equation 19 so as to enable the charge recycling in the most number of wirings.

For example, if it is assumed that the wirings are A, B, C and F, $DIntrinsic_v$ of each wiring is 1 ns and $\delta_v$ is 0.5 ns in the timing graph G(V, E) as illustrated in FIG. 27, Equation 20 and Equation 21 may be obtained from Equation 16 and Equation 17.

[Equation 20]

$$D_{PI1} = D_{PI2} = 0$$

$$D_A = 1 + \gamma_A \cdot 0.5$$

$$D_B = 1 + \gamma_B \cdot 0.5$$

$$D_C = 1 + \gamma_C \cdot 0.5$$

$$D_F = \gamma_F \cdot 0.5$$

$$D_{I1} = D_{I2} = 0$$

$$D_O = 2$$

$$D_{PO} = 0 \quad (20)$$

[Equation 21]

$$Arr_A = Arr_{PI1} + D_A$$

$$Arr_B = Arr_{PI2} + D_B$$

$$Arr_C = Arr_B + D_C$$

$$Arr_{I1} = Arr_A + D_{I1}$$

$$Arr_{I2} = Arr_C + D_{I2}$$

$$Arr_O \geq Arr_{I1} + D_O$$

$$Arr_O \geq Arr_{I2} + D_O$$

$$Arr_F = Arr_O + D_F$$

$$Arr_{PO} = Arr_F + D_{PO}$$

When the timing constraint T is set to 5 ns, Equation 22 may be obtained from Equation 18 as the constraint condition.

[Equation 22]

$$Arr_{PO} \leq 5 \quad (22)$$

Further, the object function is represented as Equation 23.

[Equation 23]

$$\Phi = \gamma_A + \gamma_B + \gamma_C + \gamma_F - Arr_O \quad (23)$$

The electrical charge recycling-enabling/-disabling determination unit 133 finds a solution that enables the charge recycling valid in the most number of wirings using the Mixed Integer Linear Programming based on as the constraint condition of Equation 22 and the object function of Equation 23.

In the example described above, $\gamma A=1$, $\gamma B=0$, $\gamma C=0$ and $\gamma F=0$ are the solutions, and the charge recycling is enabled in the wiring A and the charge recycling is disabled in the wirings B, C and F and thus, a result that the timing constraints are satisfied and also the charge recycling may be enabled in the most number of wirings may be obtained.

Accordingly, the timing constraint is satisfied and also power may be further reduced. As described above, descriptions have been made on an aspect of a method for designing the semiconductor integrated circuit of the present disclosure and an aspect of a program thereof based on the embodiments, but these aspects are illustrative only and the present disclosure is not limited thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for designing a semiconductor integrated circuit comprising:
    determining, by a designing device, first wirings over which signals are propagated and second wirings which are not used for propagation of the signals among a plurality of wirings of a semiconductor integrated circuit; and
    determining, by the designing device, from among the second wirings, third wirings to be used for storing electrical charges for electrical charge recycling of the first wirings for a most number of the first wirings in a range that satisfies a timing constraint based on operation rates of the signals propagated over the first wirings and delay times of the first wirings.

2. The method for designing a semiconductor integrated circuit according to claim 1, wherein
    whether a wiring is to be included in the first wirings or the second wirings is determined, by a designing device, based on a delay time of the wiring, a slack ratio of a signal based on the delay time and an operation rate of the signal.

3. The method for designing a semiconductor integrated circuit according to claim 2, wherein
    when the wiring is a candidate of allocation for another signal or a candidate of a wiring for storing electrical charge of another wiring, the wiring becomes difficult to be included in the first wirings as the delay time becomes larger and the wiring becomes easy to be included in the first wirings as the delay time becomes smaller.

4. The method for designing a semiconductor integrated circuit according to claim 2, wherein
    when the wiring is a candidate of allocation for another signal or a candidate of a wiring for storing electrical charge of another wiring, the wiring becomes difficult to be included in the first wirings as the operation rate of the signal becomes smaller and as an operation rate of the other signal or an operation rate of a signal of the other wiring becomes larger.

5. The method for designing a semiconductor integrated circuit according to claim 1, further comprising:
    determining, by the designing device, values of variables indicating whether the electrical charge recycling is to be enabled for the respective first wirings in a manner such that an object function obtained based on the delay times of the first wirings and the variables respectively weighted with corresponding operation rates of the signals becomes a maximum in a range that satisfies the timing constraint so as to determine the third wirings.

6. A non-transitory computer-readable recording medium storing a program that, when executed, causes a computer to perform a method for designing a semiconductor integrated circuit, the method comprising:
    determining first wirings over which signals are propagated and second wirings which are not used for propagation of the signals among a plurality of wirings of a semiconductor integrated circuit; and
    determining, from among the second wirings, third wirings to be used for storing electrical charges for electrical charge recycling of the first wirings for a most number of the first wirings in a range that satisfies a timing constraint based on operation rates of the signals propagated over the first wirings and delay times of the first wirings.

* * * * *